United States Patent
Park et al.

(10) Patent No.: US 9,905,188 B2
(45) Date of Patent: Feb. 27, 2018

(54) GATE DRIVING CIRCUIT AND DISPLAY DEVICE HAVING THE SAME

(71) Applicant: Samsung Display Co., LTD., Yongin-si, Gyeonggi-do (KR)

(72) Inventors: Junhyun Park, Suwon-si (KR);
Sunghwan Kim, Yongin-si (KR);
Seyoung Song, Hwaseong-si (KR);
Kyoungju Shin, Hwaseong-si (KR);
Jaekeun Lim, Suwon-si (KR);
Chongchul Chai, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 114 days.

(21) Appl. No.: 14/876,305

(22) Filed: Oct. 6, 2015

(65) Prior Publication Data

US 2016/0189659 A1    Jun. 30, 2016

(30) Foreign Application Priority Data

Dec. 26, 2014 (KR) ........................ 10-2014-0190828

(51) Int. Cl.
*G09G 3/36* (2006.01)
*G11C 19/28* (2006.01)

(52) U.S. Cl.
CPC ......... *G09G 3/3696* (2013.01); *G11C 19/287* (2013.01); *G09G 3/3677* (2013.01); *G09G 2310/0286* (2013.01)

(58) Field of Classification Search
CPC combination set(s) only.
See application file for complete search history.

(56) References Cited

U.S. PATENT DOCUMENTS

| | | | |
|---|---|---|---|
| 7,601,552 B2 | 10/2009 | Cheng et al. | |
| 9,431,465 B2 * | 8/2016 | Yamazaki | H01L 27/1225 |
| 2011/0210355 A1 * | 9/2011 | Yamazaki | H01L 27/1225 257/98 |
| 2013/0176195 A1 * | 7/2013 | Kim | H01L 27/3262 345/80 |

(Continued)

FOREIGN PATENT DOCUMENTS

| | | |
|---|---|---|
| KR | 1020070114533 A | 12/2007 |
| KR | 1020080016012 A | 2/2008 |

(Continued)

*Primary Examiner* — Van Chow
(74) *Attorney, Agent, or Firm* — H.C. Park & Associates, PLC

(57) ABSTRACT

Provided is a gate driving circuit including driving stages which provide a plurality of pixels of a display panel with gate signals, wherein any one of the driving stages includes a thin film transistor including a first control electrode, an activation part overlapping the first control electrode, an input electrode overlapping the activation part, an output electrode overlapping the activation part, and a second electrode disposed on the first control electrode and the activation part; and a capacitor including a first electrode disposed on the layer on which the first control electrode is disposed, a second electrode, which overlaps at least a portion of the first electrode and is disposed on the layer on which the input electrode is disposed, and a third electrode which overlaps the first and second electrodes and is electrically connected to the first electrode.

8 Claims, 18 Drawing Sheets

(56) References Cited

U.S. PATENT DOCUMENTS

2013/0309808 A1 11/2013 Zhang et al.
2014/0092078 A1* 4/2014 Yoon ..................... G09G 5/001
                                                                345/212

FOREIGN PATENT DOCUMENTS

| KR | 1020080029100 A | 4/2008 |
|----|-----------------|--------|
| KR | 100923947 B1    | 10/2009 |
| KR | 1020110113040 A | 4/2010 |
| KR | 1020110127861 A | 11/2011 |
| KR | 1020130081089 A | 7/2013 |
| KR | 101322732 B1    | 10/2013 |
| KR | 1020140042308 A | 4/2014 |

* cited by examiner

GATE DRIVING CIRCUIT AND DISPLAY DEVICE HAVING THE SAME

CLAIM OF PRIORITY

This U.S. non-provisional patent application claims the priority of and all the benefits accruing under 35 U.S.C. § 119 of Korean Patent Application No. 10-2014-0190828, filed on Dec. 26, 2014 in the Korean intellectual Property Office (KIPO), the entire contents of which are hereby incorporated by reference.

BACKGROUND OF THE INVENTION

1. Field of Disclosure

The present disclosure herein relates to a gate driving circuit and a display device having the same, and more particularly, to a gate driving circuit integrated on a display panel and a display device having the same.

2. Description of the Related Art

A display device includes a plurality of gate lines, a plurality of data lines, and a plurality of pixels connected to the plurality of gate lines and the plurality of data lines. The display device includes a gate driving circuit which sequentially provides the plurality of gate lines with gate signals, and a data driving circuit which sequentially outputs data signals to the plurality of data lines.

The gate driving circuit includes a shift register having a plurality of driving stages. The plurality of driving stages output respective gate signals corresponding to the plurality of gate lines. Each of the plurality of driving stages includes a plurality of transistors which are interactively connected to each other.

SUMMARY OF THE INVENTION

The present disclosure provides a gate driving circuit which has a reduced layout area. The present disclosure also provides a display device which may have a reduced bezel width.

Embodiments of the inventive concept provide gate driving circuits including driving stages which provide a plurality of pixels of a display panel with gate signals, wherein any one of the driving stages includes a thin film transistor including a first control electrode, an activation part overlapping the first control electrode, an input electrode overlapping the activation part, an output electrode overlapping the activation pan, and a second control electrode disposed on the first control electrode and the activation part; and a capacitor including a first electrode disposed on the layer on which the first control electrode is disposed, a second electrode which overlaps at least a portion of the first electrode and is disposed on the layer on which the input electrode is disposed, and a third electrode which overlaps the first and second electrodes and is electrically connected to the first electrode.

In some embodiments, the third electrode may be disposed on the layer on which the second control electrode is disposed.

In other embodiments, the first control electrode may be electrically connected to the first electrode, and the output electrode may be electrically connected to the second electrode.

In some embodiments, the second control electrode may be electrically connected to the first control electrode.

In still other embodiments, the third electrode and the second control electrode are connected to each other to form an integrated shape.

In even other embodiments, the gate driving circuits may further include a first insulating layer disposed between the first and second electrodes; and a second insulating layer disposed between the second and third electrodes, wherein the input electrode and the output electrode may be disposed on the first insulating layer, the second control electrode may be disposed on the second insulating layer, and the third electrode may be connected to the first electrode by passing through the first and second insulating layers.

In yet other embodiments, the first insulating layer may further include a recessed portion defined in a portion of a region overlapping the first electrode, and the second electrode may be disposed on the recessed portion.

In further embodiments, the driving stages may be dependently connected, and the driving stages may sequentially output the gate signals.

In still further embodiments, any one of the driving stages may include a clock terminal which receives a clock signal and an output terminal which outputs a corresponding gate signal of the gate signals, the thin film transistor may receive the clock signal and output the corresponding gate signal, and the capacitor may be connected to the output terminal.

Other embodiments of the inventive concept provide display devices including a base substrate divided into a pixel region and a peripheral region adjacent to the pixel region; pixels disposed in the pixel region; a first signal lines which are connected to the pixels, and each of which extends in one direction; a second signal lines which are connected to the pixels and insulated and intersected with the first signal lines; and a driving circuit which is disposed in the peripheral region to provide the first signal lines with electrical signals, and includes a driving transistor and a driving capacitor connected to the driving transistor.

Herein, the driving transistor includes a first control electrode disposed on the layer on which the first signal lines are disposed; an activation part overlapping the first control electrode; an input electrode which is disposed on the layer on which the second signal lines are disposed and overlaps at least a portion of the activation part; an output electrode which is disposed on the layer on which the second signal lines are disposed, is spaced apart from the input electrode, and overlaps at least a portion of the activation part; and a second control electrode which is disposed on the input electrode and output electrode and overlaps the first control electrode, and the capacitor includes a first electrode disposed on the layer on which the first signal lines are disposed; a second electrode disposed on the layer on which the second signal lines are disposed; and a third electrode disposed on the layer on which the second control electrode is disposed, wherein the first and third electrodes are electrically connected to each other.

In some embodiments, the display devices may include a first insulating layer disposed between the first and second signal lines; and a second insulating layer disposed on the second signal lines, wherein the input electrode, the output electrode, and the second electrode may be disposed on the first insulating layer, the second control electrode and the third electrode may be disposed on the second insulating layer, and the third electrode may be connected to the first electrode by passing through the first and second insulating layers.

In other embodiments, each of the pixels may include a pixel transistor connected to a corresponding first signal line of the first signal lines and a corresponding second signal line of the second signal lines; and a liquid crystal capacitor including a first display electrode electrically connected to the pixel transistor, and a second display electrode which is disposed on the first display electrode and generates an electric field with the first display electrode to control a liquid crystal layer disposed on the first display electrode wherein the liquid crystal capacitor may be disposed on the second insulating layer.

In still other embodiments, the second display electrode may be spaced apart from the first display electrode with the liquid crystal layer disposed therebetween, and the second control electrode and the third electrode may be disposed on the layer on which the first display electrode is disposed.

In even other embodiments, the display devices may further include a third insulating layer covering the first display electrode, wherein the liquid crystal layer may be disposed on the thud insulating layer, and the second display electrode may be disposed between the third insulating layer and the liquid crystal layer.

In yet other embodiments, the second control electrode and the third electrode may be disposed on the layer on which the second display electrode is disposed, and the third electrode may be connected to the first electrode by passing through the first to third insulating layers.

In further embodiments, the display devices may further include a sub-electrode which is disposed between the second and third insulating layers and overlaps the first control electrode, wherein the second control electrode may be connected to the sub-electrode by passing through the third insulating layer.

In still further embodiments, the second control electrode and the third electrode may be disposed on the layer on which the first display electrode is disposed.

In even further embodiments, at least an one of the first and second display electrodes may include at least one slit.

In yet further embodiments, the first insulating layer may further include a recessed portion defined in a region overlapping the first electrode, and the second electrode may be disposed on the recessed portion.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Hereinafter, the inventive concept will be described in detail with reference to the accompanying drawings.

Figure 1A:
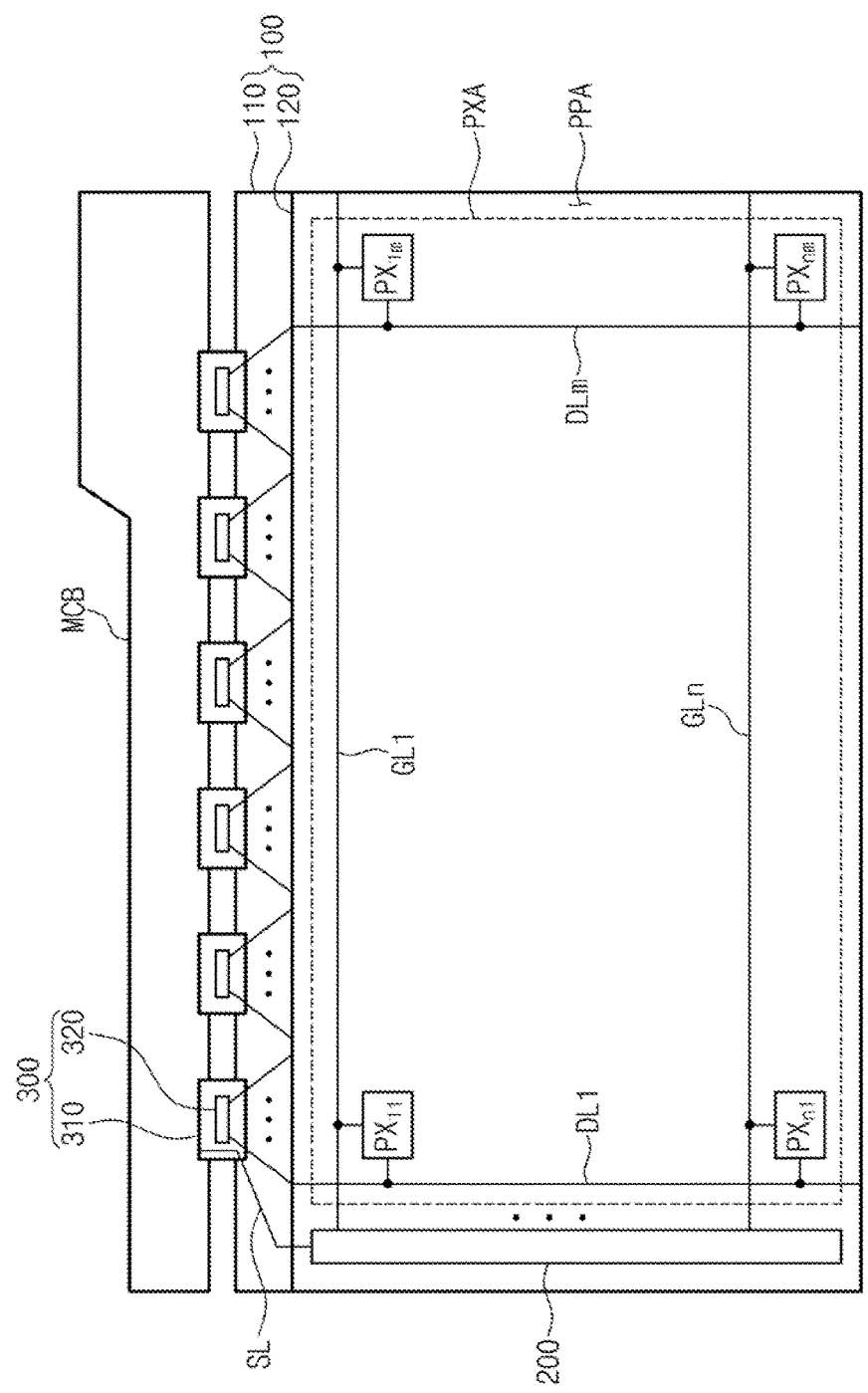
FIGS. 1A and 1B are plan views schematically illustrating display devices according to embodiments of the inventive concept.
Figure 1B:
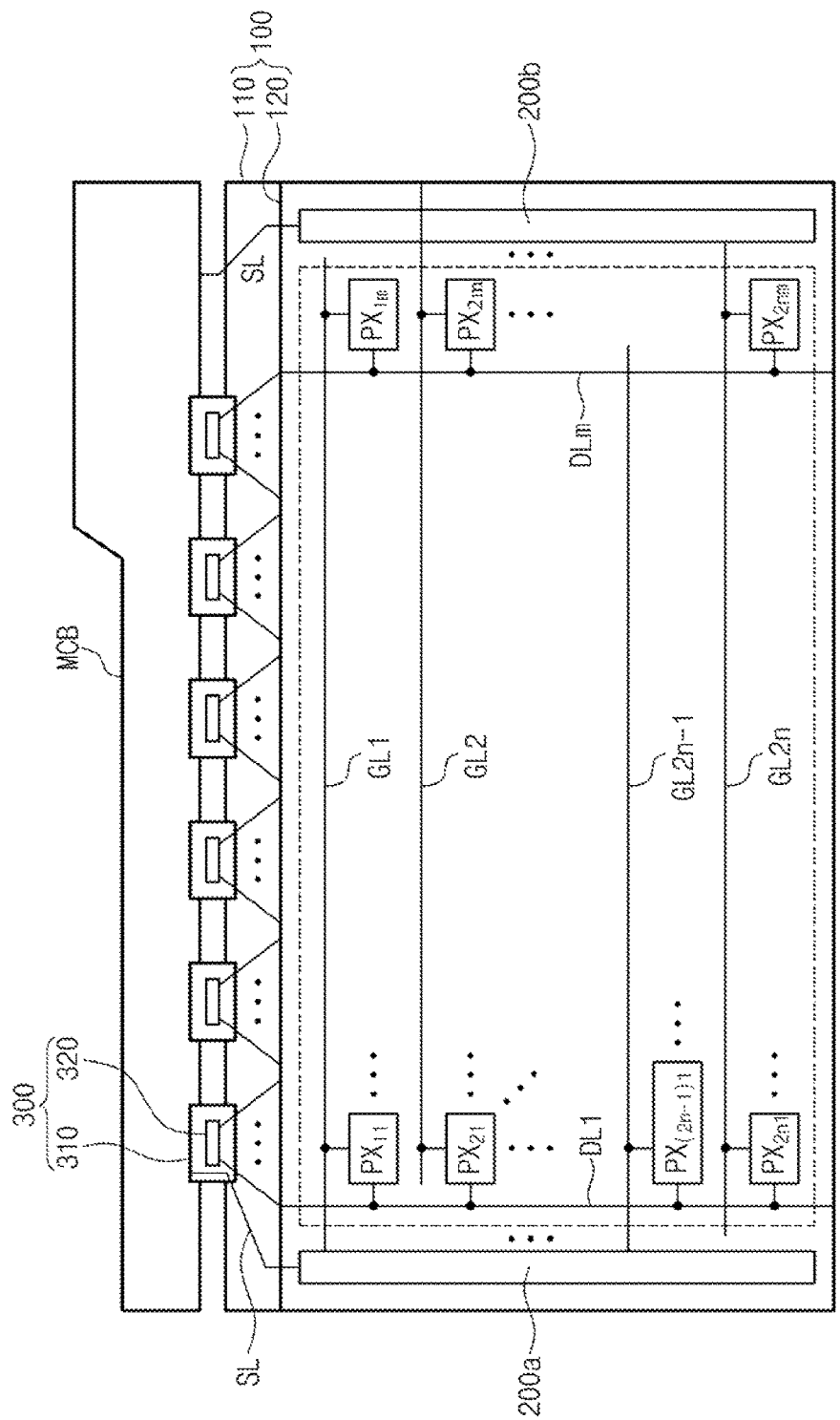

FIGS. 1A and 1B are plan views schematically illustrating display devices according to embodiments of the inventive concept. As illustrated in FIGS. 1A and 1B, a display device includes a display panel 100, a gate driving circuit 200, and a data driving circuit 300.

The display panel 100 may include, but is not limited to, a variety of display panels such as a liquid crystal display panel, an organic light emitting display panel, an electrophoretic display panel, and an electrowetting display panel. In this embodiment, the display panel 100 is described as a liquid crystal display panel. Alternatively, a liquid crystal display device including the liquid crystal display panel may further include a polarizer, a backlight unit, and the like which are not illustrated.

The display panel 100 includes a first substrate 110, a second substrate 120 spaced apart from the first substrate 110 when a cross section of the display panel 100 is viewed, and a liquid crystal layer LCL (FIG. 3) disposed between the first and second substrates 110 and 120. The second substrate 120 may expose a portion of the first substrate 110 on a plane.

The display panel 100 may be divided into a pixel region PXA and a peripheral region PPA. A plurality of pixels PX11 to PXnm (where n and in being natural numbers, and n being a row number and m being a column number) are disposed in the pixel region PXA. In FIG. 1, only some of the pixels PX11 to PXnm are illustrated. The pixel region PXA may display an image as electrical signals are applied to the pixel region PXA.

The peripheral region PPA is adjacent to the pixel region PXA, FIG. 1 illustrates a peripheral region PPA having a frame shape surrounding the edges of the pixel region PXA. In the peripheral region PPA, driving, circuits for driving the pixels PX11 to PXnm and various connection wirings may be disposed. The peripheral region PPA may be a main factor which determines the bezel area of a display device.

The display panel 100 includes a plurality of gate lines GL1 to GLn disposed on the first substrate 110 and a plurality of data lines DL1 to DLm which intersect with the gate lines GL1 to GLn and are disposed on the first substrate 110. The Rate lines GL1 to GLn and the data lines DL1 to DLm are connected to respective corresponding pixels of the pixels PX11 to PXnm.

The gate driving circuit 200 and a main circuit board MCB are connected through a signal line SL. The gate driving circuit 200 receives a control signal through the signal line SL from a timing controller (not illustrated) mounted on the main circuit board MCB.

The gate driving circuit 200 is disposed on one side a the first substrate 110. The gate driving circuit 200 is disposed in the peripheral region PPA and connected to the gate lines GL1 to GLn. The gate driving circuit 200 sequentially outputs gate signals to the gate lines GL1 to GLn, in response to the control signal transferred through the signal line SL.

The gate driving circuit 200 may be formed simultaneously with the pixels PX11 to PXnm through a thin film process. For example, in the peripheral region PPA, the gate driving circuit 200 may be mounted as an amorphous silicon TFT gate driver circuit (ASG) type or an oxide silicon TFT gate driver circuit (OSG) type.

FIG. 1A exemplarily illustrates one gate driving circuit 200 connected to left ends of the gate lines GL1 to GLn. Alternatively, a display device according to an embodiment of the inventive concept may also include two gate driving circuits 200a and 200b (FIG. 1B).

In this case, one of the two gate driving circuits 200a and 200b may be connected to left ends of the gate lines GL1 to GL2n, and the other may be connected to right ends of the gate lines GL1 to GL2n. Alternatively, one of the two gate driving circuits 200a and 200b may be connected to odd-numbered gate lines (GL1, GL3, GL5, . . . , GL2n-1), and the other may be connected to even-numbered gate lines (GL2, GL4, GL6, . . . , GL2n).

If the gate driving circuit 200 is integrated on the first substrate 110, driving chips for embedding the gate driving circuit 200 or a printed circuit board (PCB) on which the gate driving circuit 200 is mounted may be omitted. Accordingly, the size and thickness of a display device may be reduced.

The gate driving circuit 200 according to this embodiment is mounted on the first substrate 110, and the gate driving circuit 200 is thus limited to have an area less than or equal to the area of the peripheral region PPA. The area of the gate driving circuit 200 varies with the number and area of various elements constituting the gate driving circuit 200.

As the area of the gate driving circuit 200 increases, driving characteristics of a display device may be improved. However, a larger area of the gate driving circuit 200 may cause a problem that the bezel of a display device becomes broader because the peripheral region PPA becomes larger. This will be described in detail later.

The data driving circuit 300 receives a control signal and image data from the timing controller of the main circuit board MCB. The data driving circuit 300 generates analogue data voltages corresponding to the image data.

The data driving circuit 300 is connected to the data lines DL1 to DLm. The data driving circuit 300 outputs data voltages to corresponding data lines DL1 to DLm, in response to the control signal from the timing controller installed in the main circuit board MCB.

The data driving, circuit 300 may include a plurality of driving chips 310 and flexible circuit boards 320 on which the driving chips 310 are respectively mounted. The flexible circuit boards 320 electrically connect the main circuit board. MCB and the first substrate 110. The driving chips 310 output data signals to the corresponding data lines of the data lines DL1 to DLm.

FIGS. 1A and 1B exemplarily illustrate data driving, circuits 300 of a tape carrier package (TCP) type. Although not illustrated, according to an embodiment of the inventive concept, the data driving circuit 300 may also be disposed in the peripheral region PPA of the first substrate 110 by a chip on glass (COG) method.

Figure 2:
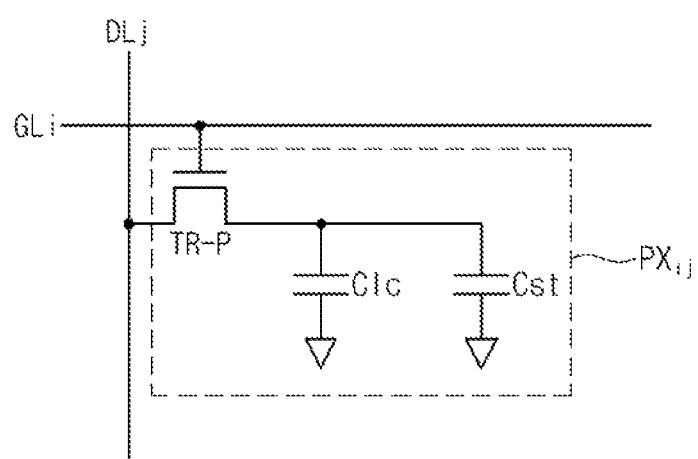
FIG. 2 is an equivalent circuit diagram of a pixel according to an embodiment of the inventive concept.
Figure 3:
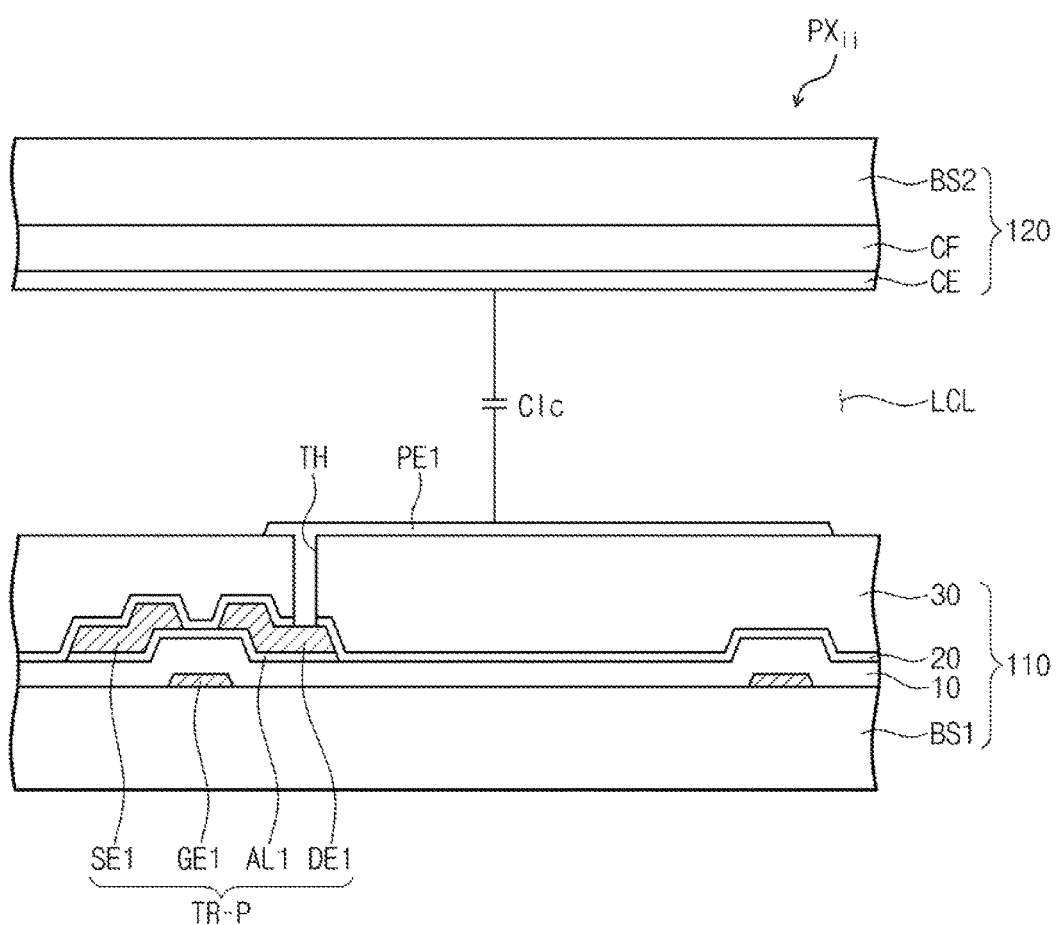
FIG. 3 is a sectional view of a pixel according to an embodiment of the inventive concept.

FIG. 2 is an equivalent circuit diagram of a pixel according to an embodiment of the inventive concept. FIG. 3 is a sectional view of a pixel according to an embodiment of the inventive concept. FIG. 2 exemplarily illustrates one pixel PXij of the pixels PX11 to PXnm in FIG. 1. FIG. 3 illustrates a sectional view of the pixel PXij illustrated in FIG. 2.

The pixel PXij includes a pixel thin film transistor TR-P (hereinafter, referred to as a "pixel transistor"), a liquid crystal capacitor Clc, and a storage capacitor Cst. Hereinafter, in this specification, a transistor refers to a "thin film transistor".

The pixel transistor TR-P is electrically connected to an i-th gate line GLi and a j-th data line DLj. The pixel transistor TR-P outputs a data voltage corresponding to a data signal received from the j-th data line DLj, in response to a gate signal received, from the i-th gate line GLi.

The liquid crystal capacitor Clc charges the data voltage, output from the pixel transistor TR-P. Transmittance of a liquid crystal layer LCL (FIG. 3) is controlled according to the charge amount charged in the liquid crystal capacitor Clc. A display device displays a desired image to the display panel 100 by controlling transmittance of the liquid crystal layer LCL.

The storage capacitor Cst is connected in parallel to the liquid crystal capacitor Clc. The storage capacitor Cst maintains transmittance of the liquid crystal layer LCL for a certain period of time.

The first substrate 110 includes a first base substrate BS1, the pixel transistor TR-P, first display electrode PE1, and a storage line STL.

A control electrode GEL of the pixel transistor TR-P, the i-th gate line GLi, and the storage line STE are disposed on the first base substrate BS1. The control electrode GE1 is branched from the i-th gate line GLi.

The control electrode GE1, the i-th gate line GLi, and the storage STL may be made of the same material, and may have the same structure. For example, the control electrode GE1, the i-th gate line GLi, and the storage line STE may include a metal such as aluminum (Al), silver (Ag), copper (Cu), molybdenum (Mo), chromium (Cr), tantalum (Ta) or titanium (Ti), or alloys thereof and the like. Each of the control electrode GE1, the i-th gate line GLi, and the storage line STL may have a multi-layered structure.

A first insulating layer 10 is disposed on the first base substrate BS1. The first insulating layer 10 covers the control electrode GE1, the i-th gate line GLi, and the storage line STL. In this embodiment, the first insulating layer 10 may be a gate insulating layer.

The first insulating layer 10 may be an organic layer or an inorganic layer. For example, the first insulating layer 10 may include a silicon nitride layer or a silicon oxide layer. Furthermore, the first insulating layer 10 may have a multi-layered structure in which organic layers and/or inorganic layers are stacked.

An activation part AL1 is disposed on the first insulating layer 10. The activation part AL1 overlaps the control electrode GE1. The activation part AL1 may include a channel which is not illustrated. The channel is a charge transfer port in the activation part AL1.

The activation part AL1 includes a semiconductor material. For example, the activation part AL1 may include silicon or an oxide semiconductor.

An input electrode SE1 and an output electrode DE1 are disposed on the activation part AL1. The input electrode SE1 and the output electrode DE1 are spaced apart from each other. The input electrode SE1 and the output electrode DE1 each partially overlaps the control electrode GE1.

In this case, the activation part AL1 may further include an ohmic contact layer which is not illustrated. In the activation part AL1, the ohmic contact layer may be provided in a region which contacts with the input electrode SE1 and a region which contacts with the output electrode DE1. The ohmic contact layer reduces resistances between the activation part AL1 and the input electrode SE1, and between the activation part AL1 and the output electrode DE1.

FIG. 1 exemplarily illustrates a pixel transistor TR-P having a staggered structure. The structure of the pixel transistor TR-P is not limited thereto. The pixel transistor TR-P may also have a planar structure.

A second insulating layer 20 may be disposed on the first insulating layer 10. The second insulating layer 20 covers the pixel transistor TR-P. In this embodiment, the second insulating layer 20 may be a passivation layer.

The second insulating layer 20 may include at least any one of inorganic or organic substances. For example, the second insulating layer 20 may include a silicon nitride layer or a silicon oxide layer. Alternatively, the second insulating layer 20 may have a multi-layered structure in which organic layers and/or inorganic layers are stacked.

A third insulating layer 30 is disposed on the second insulating layer 20. The third insulating layer 30 may include at least any one of inorganic or organic substances. For example, the third insulating layer 30 may include a silicon nitride layer or a silicon oxide layer.

Alternatively, the third insulating layer 30 may have a multi-layered structure in which organic layers and/or inorganic layers are stacked. When the third insulating layer 30 includes an organic layer, the third insulating layer 30 may provide an upper side with a substantially flat top surface that is unmarred by discontinuities, irregularities, or flaws in the uniformity of the top surface.

The first display electrode PE1 is disposed on the third insulating layer 30. The first display electrode PE1 is connected to the output electrode DE1 via a through hole TH which passes through the second and third insulating layers 20 and 30.

Accordingly, a driving voltage may be applied to the third insulating layer 30. Alternatively, although not illustrated, an alignment layer which covers the first display electrode PE1 may be further disposed on the third insulating layer 30.

The first display electrode PE1 overlaps the storage line STL to constitute the storage capacitor Cst (see FIG. 2). The first display electrode PE1 and the storage line STL generate an electric field with the first to third insulating layers 10, 20, and 30 disposed therebetween.

The second substrate 120 is disposed facing the first substrate 110. The second substrate 120 includes a second base substrate BS2, a color filter layer CF, and a second display electrode PE2.

The color filter layer CF is disposed on one surface of the second base substrate BS2, The second display electrode PE2 is disposed on the color filter layer CF. A common voltage may be applied to the second display electrode PE2. The common voltage and the driving voltage have different electric potential values.

In this embodiment, the second display electrode PE2 constitutes the second substrate 120. The second display electrode PE2 is spaced apart from the first display electrode PE1, with a liquid crystal layer LCL disposed therebetween.

Meanwhile, this is only an exemplary embodiment. Thus, at least any one of the color filter layer CF and the second display electrode PE2 according to an embodiment of the inventive concept may constitute the first substrate 110, and the inventive concept is not limited to any one embodiment. In other words, the display panel 100 according to this embodiment may be a vertical alignment (VA) mode, a patterned vertical alignment (PVA) mode, an in switching (IPS) mode, a fringe-field switching (FFS) mode, or a plane to line switching (PLS) mode.

An alignment layer (not illustrated) which covers the second display electrode PE2 may be further disposed on the second display electrode PE2. Furthermore, an insulating layer may be further disposed between the color filter layer CF and the second display electrode PE2.

Figure 4:
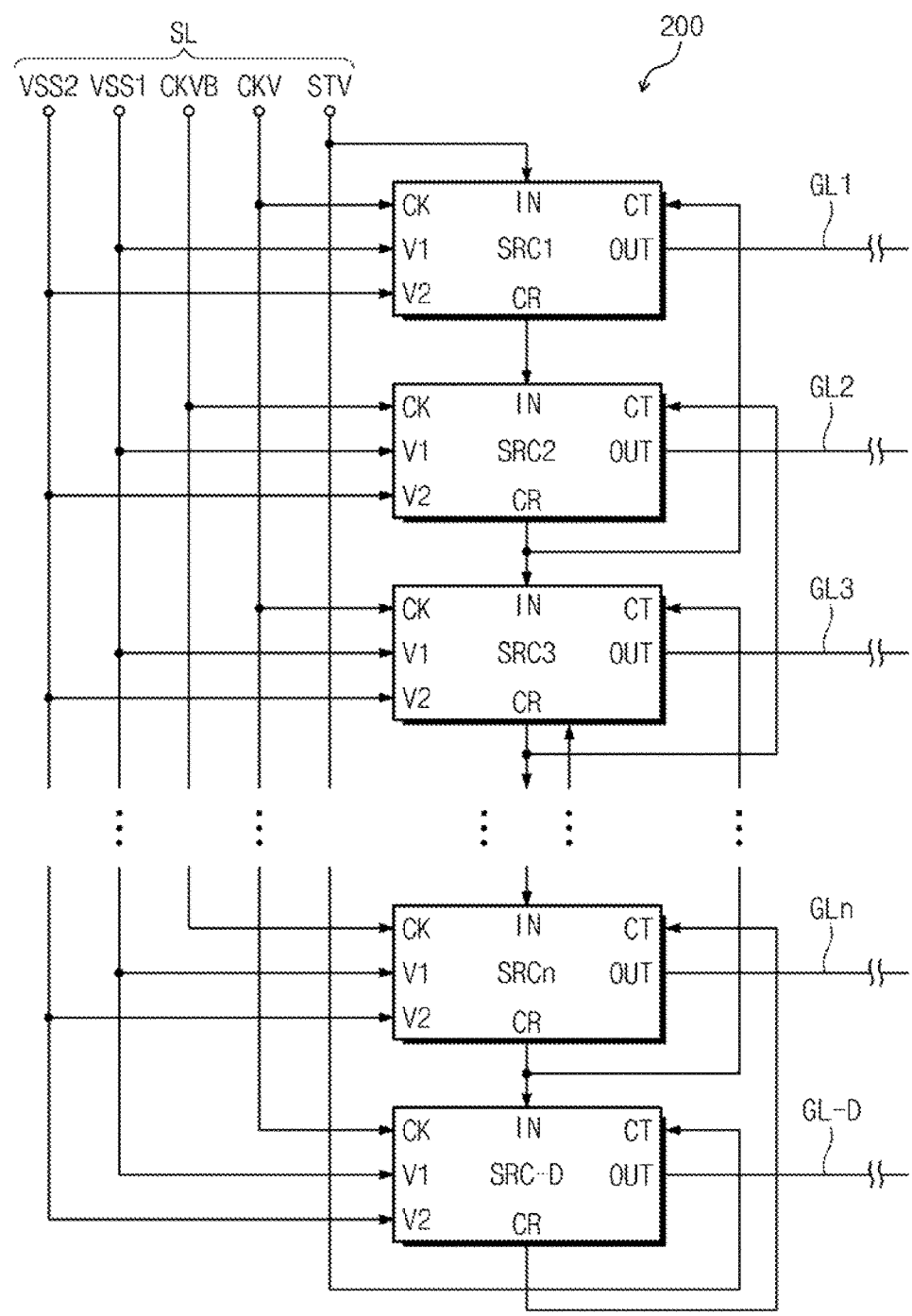
FIG. 4 is a block diagram of a gate driving circuit according to an embodiment of the inventive concept.

FIG. 4 is a block diagram of a gate driving circuit according to an embodiment of the inventive concept. As illustrated in FIG. 4 the gate driving circuit 200 includes a plurality of driving stages SRC1 to SRCn. The driving stages SRC1 to SRCn are dependently connected one after another to each other.

A signal line SL includes a plurality of lines. Each line provides the gate driving circuit 200 with control signals from the timing controller installed in the main circuit board MCB. In this embodiment, the lines provides the gate driving circuit 200 with a first voltage VSS1, a second voltage VSS2, a first clock signal CKVA, a second clock signal CKVB, and a start signal STV, respectively.

Alternatively, the gate driving circuit 200 may further include a dummy stage SRC-D which is connected to the driving stage SRCn disposed at the end of the driving stages SRC1 to SRCn. The dummy stage SRC-D is connected to a dummy gate line GL-D.

Each of the driving stages SRI to SRCn includes an output terminal OUT, a carry terminal CR, an input, terminal IN, a control terminal CT, a clock terminal CK, a first voltage input terminal V1, and a second voltage input terminal V2.

The output terminal OUT is connected to a corresponding gate line of the gate lines GL1 to GLn. Gate signals generated from the driving stages SRC1 to SRCn are provided to the gate lines GL1 to GLn through the output terminal OUT.

The carry terminal CR is electrically connected to an input terminal IN of a driving stage next to a corresponding driving stage. The carry terminal CR outputs a carry signal of the corresponding driving stage.

The input terminal IN receives a carry signal of a driving stage preceding a corresponding driving stage. For example, an input terminal IN of a third driving stage SRC3 receives a carry signal of a second driving stage SRC2.

Meanwhile, an input terminal of the first driving stage SRC1 of the driving stages SRC1 to SRCn receives the start signal STV instead of a carry signal of a previous driving stage. The start signal STV starts driving of the gate driving circuit 200.

The control terminal CT is electrically connected to a carry terminal CR of a driving stage next to a corresponding driving stage. The control terminal CT receives a carry signal of a driving stage next to a corresponding driving stage.

For example, a control terminal CT of the second driving stage SRC2 receives a carry signal output from a carry terminal CR of the third driving stage SRC3. According to an embodiment of the inventive concept, a control terminal CT of each of the plurality of driving stages SRC1 to SRCn may also be electrically connected to an output terminal OUT of a driving stage next to a corresponding driving stage.

Meanwhile, a control terminal CT of the driving stage SRCn which is disposed at the end receives a carry signal output from a carry terminal CR of the dummy stage SRC-D. A control terminal CT of the dummy stage SRC-D receives the start signal STV.

The clock terminal CK receives either the first clock signal CKVA or the second clock signal CKVB. The first clock signal CKVA and the second clock signal CKVB may have different phases.

The first clock signal CKVA and the second clock signal CKVB may be alternately input to adjacent driving stages of the driving stages SRC1 to SRCn. For example, respective clock terminals CK of odd-numbered driving stages SRC1 and SRC3 of the driving stages SRC1 to SRCn may receive the first clock signal CKVA, and respective clock terminals CK of even-numbered driving stages SRC2 and SRCn of the driving stages SRC1 to SRCn may receive the second clock signal CKVB.

The first voltage input terminal V1 receives the first voltage VSS1. Respective second voltage input terminals V2 of the driving stages SRC1 to SRCn receive the second voltage VSS2. The second voltage VSS2 has a lower level than the first voltage VSS1.

Alternatively, each of the driving stages SRC1 to SRCn, according to the circuit configuration thereof, may not have any one of the output terminal OUT, the input terminal IN, the carry terminal CR, the control terminal CT, the clock terminal CK, the first voltage input terminal V1, and the second voltage input terminal V2, or may further include other terminals. For example, either the first voltage input terminal V1 or the second voltage input terminal V2 may be omitted. Furthermore, connection relationships between the driving stages SRC1 to SRCn may be altered.

Figure 5:
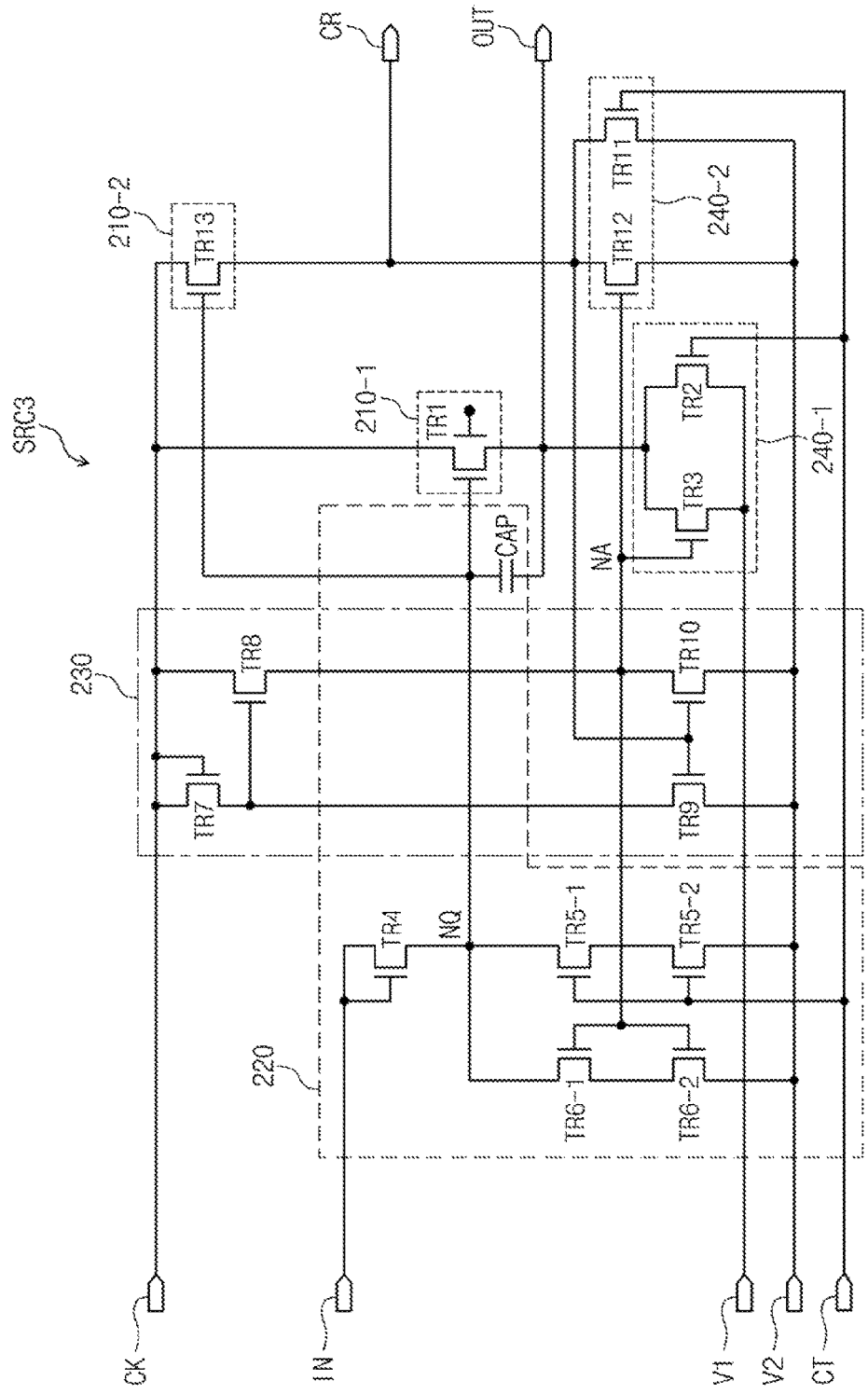
FIG. 5 is a circuit diagram of a driving stage according to an embodiment of the inventive concept.
Figure 6:
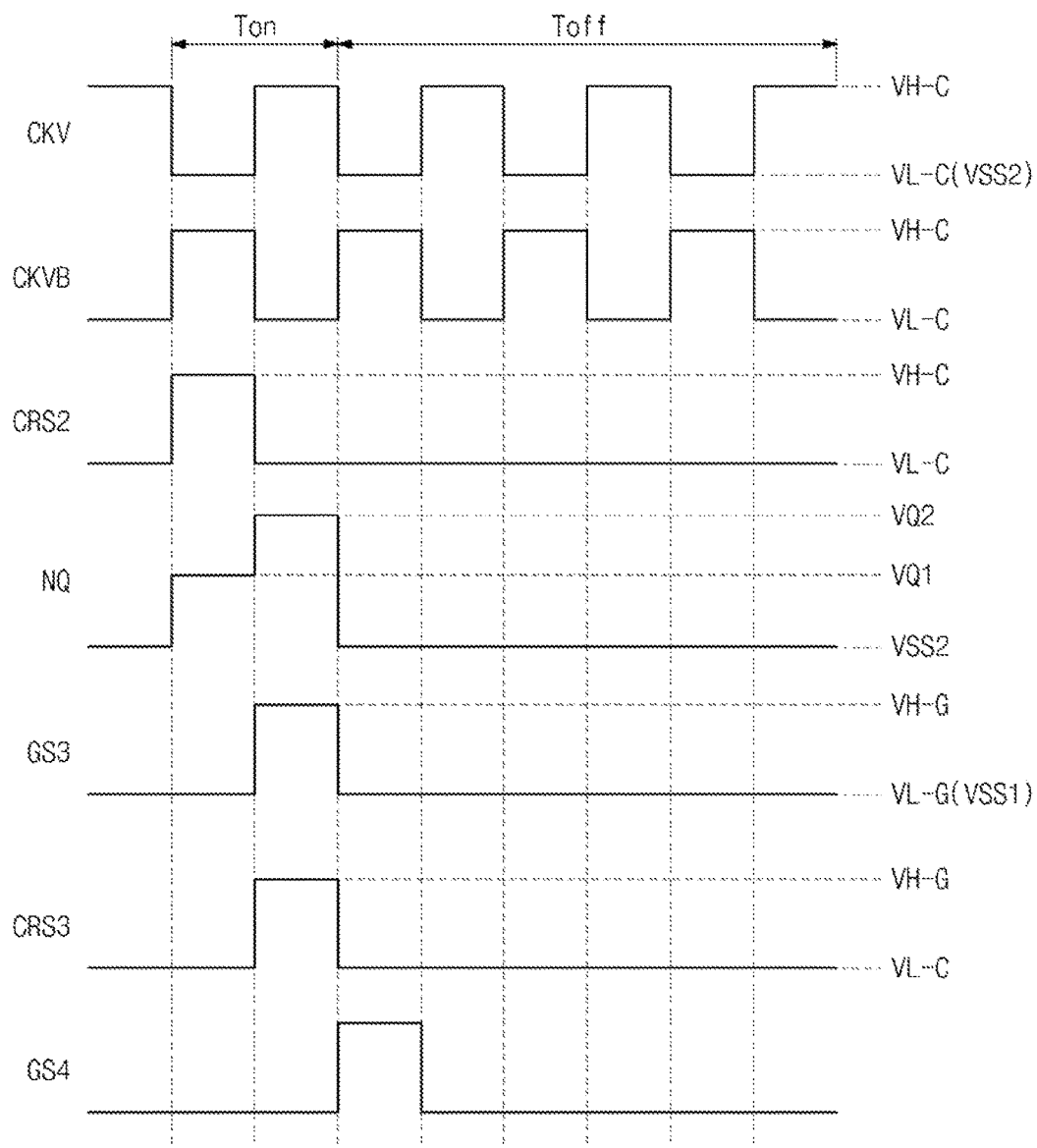
FIG. 6 is a waveform diagram illustrating input and output signals of the driving stage illustrated in FIG. 5.

FIG. 5 is a circuit diagram of a driving stage according to an embodiment of the inventive concept. FIG. 6 is a waveform diagram illustrating input and output signals of the driving stage illustrated in FIG. 5.

FIG. 5 exemplarily illustrates the third driving stage SRC3 of the driving stages SRC1 to SRCn illustrated in FIG. 4. Each of the driving stages SRC1 to SRCn illustrated in FIG. 4 may have the same circuit as the third driving stage SRC3 (hereinafter, referred to as a driving stage).

As illustrated in FIG. 5, the driving stage SRC3 includes output parts 210-1 and 210-2, a control part 220, an inverter part 230, and pull-down parts 240-1 and 240-2. The output parts 210-1 and 210-2 include a first output part 210-1 which outputs a third gate signal GS3 and a second output part 210-2 which outputs a third carry signal CRS3.

The pull-down parts 240-1 and 240-2 include a first pull-down part 240-1 which pull-downs the output terminal OUT and a second pull-down part 240-2 which pull-downs the carry terminal CR. Meanwhile, the circuit of the driving stage SRC3 is merely exemplary, and may be altered.

The first output part 210-1 includes a first output transistor TR1. The first output transistor TR1 includes an input electrode which is connected to the clock terminal CK to receive the first clock signal CKVA, a control electrode connected to a first node NQ, and an output electrode which is connected to the output electrode OUT to output the third gate signal GS3.

The first output transistor TR1 may have a dual-gate (or double-gate) structure including a plurality control electrodes. The first output transistor TR1 has a dual-gate structure, and driving current of the first output transistor TR1 may thus increase. Therefore, on-off characteristics of the first output part 210-1 may be improved.

Meanwhile, in this embodiment, a section that the first output transistor TR1 is turned on may be defined as an on-section Ton, and a section other than the on-section Ton may be defined as an off-section Toff. Hereinafter, operation characteristics of the driving stage SRC3 will be described based on the on-section Ton and the off-section Toff.

The second output part 210-2 includes a second output transistor TR13. The second output transistor TR13 includes an input electrode which is connected to the clock terminal CK to receive the first clock signal CKVA, a control electrode connected to the first node NQ, and an output electrode which is connected to the carry terminal CR to output the third carry signal CRS3.

The first clock signal CKVA includes low-level sections having a low level of low voltage VL-C and high-level sections having a relatively high level of high voltage VH-C. In this embodiment, the low voltage VL-C may have the same level as the second voltage VSS2.

Alternatively, the first clock signal CKVA and the second clock signal CKVB may have opposite phases each other. Therefore, the second dock signal CKVB includes low-level and high-level sections alternating with those of the first clock signal CKVA.

The third gate signal GS3 includes low-level sections having a low level of low voltage VL-G and high-level sections having a relatively high level of high voltage VH-G. The low voltage VL-G of the third gate signal GS3 may have the same level as the first voltage VSS1.

The third carry signal CRS3 includes low-level sections having a low level of low voltage VL-C and high-level sections having a relatively high level of high voltage VH-C. The third carry signal CRS3 has a voltage level similar to that of the first clock signal CKVA because the third carry signal CRS3 is generated based on the first clock signal CKV.

Referring to FIGS. 5 and 6 again, the control part 220 controls operations of the first and second output parts 210-1 and 210-2. For example, during the on-section Ton, the control part 220 turns on the first and second output parts 210-1 and 210-2 in response to a second carry signal CRS2 output from the second driving stage SRC2.

During the off-section Toff, the control pan 220 turns off the first and second output parts 210-1 and 210-2 in response to the second carry signal CRS2. In addition, the control part 220 maintains turn-off of the first and second output parts 210-1 and 210-2 depending on a switching signal output from the inverter part 230.

The control part 220 includes a first control transistor TR4, second control transistors TR5-1 and TR5-2, third control transistors TR6-1 and a capacitor CAP. In this embodiment, two second control transistors TR5-1 and TR5-2 which are connected in series and two third control transistors TR6-1 and TR6-2 which are connected in series are exemplarily illustrated.

The first control transistor TR4 controls the electric potential of the first node NQ. The first control transistor TR4 includes a control electrode and an output electrode which receive the second carry signal CRS2 in common. The first control transistor TR4 includes an output electrode connected to the first node NQ.

The two second control transistors TR5-1 and TR5-2 are connected in series between the second voltage input terminal V2 and the first node NQ. Control electrodes of the two second control transistors TR5-1 and TR5-2 are connected to the control terminal CT in common.

The two second control transistors TR5-1 and TR5-2 provide the first node NQ with the second voltage VSS2, in response to a fourth carry signal (not illustrated) output from a fourth driving stage. Alternatively, according to an embodiment of the inventive concept, the two second control transistors TR5-1 and TR5-2 may also be turned on by a fourth gate signal GS4.

The two third control transistors TR6-1 and TR6-2 are connected in series between the second voltage input terminal V2 and the first node NQ. Control electrodes of the two third control transistors TR6-1 and TR6-2 are connected a second node NA in common. The two third control transistors TR6-1 and TR6-2 provide the first node NQ with the second voltage VSS2, in response to a switching signal output from the inverter part 230.

The capacitor CAP is connected between the output electrode of the first output transistor TR1 and the first node NQ. Alternatively, although not illustrated, the capacitor CAP according to an embodiment of the inventive concept may have a dual-capacitor structure.

Specifically, the capacitor CAP includes a first electrode connected to the output terminal OUT, a second electrode which is connected to the first node NQ and generates an electric field with the first electrode, and a third electrode which is electrically connected to the first electrode and generates an electric field with the second electrode.

The electric potential of the first node NQ is boosted up as electric potentials of the output terminal OUT and the carry terminal CR increase. Specifically, the electric field of the first node NQ is boosted by the capacitor CAP.

By a boot-strapping operation according to such a boost-up, the electric potential of the first node NQ increases to a second high voltage VQ2 from a first high voltage VQ1. When the electric potential of the first node NQ increases to the second high voltage VQ2, the gate signal GS3 of the high voltage VH-G is output.

The electric potential of the first node NQ is lowered to the second voltage VSS2 as the electric potential of the control terminal CT increases. Accordingly, the first output part. 210-1 or the second output pan 210-2 is turned off. Furthermore, the electric potential of the first node NQ may also be lowered to the second voltage VSS2 as the electric potential of the second node NA increases.

The size of sections in which the first node NQ is boosted may be determined depending on capacitance of the capacitor CAP. Accordingly, it is possible to determine charging time taken to charge a data voltage in each of the pixels PX11 to PXnm (FIG. 1) Which are connected to the gate lines GL1 to GLn (see FIG. 1). Therefore, as capacitance of the capacitor CAP is higher, the boosting section becomes longer such that each pixel may secure a sufficient time to be provided with a data voltage.

The gate driving circuit 200 according to the inventive concept forms the capacitor CAP as a dual-capacitor structure, and thus increases capacitance of the capacitor CAP. Therefore, the gate driving circuit 200 may reduce the area of a capacitor while maintaining desired capacitance standard, and the layout area of the gate driving circuit 200 may thus be reduced.

Alternatively, according to an embodiment of the inventive concept, any one of the two second control transistors TR5-1 and TR5-2 may be omitted, and any one of the two third control transistors TR6-1 and TR6-2 may be omitted. Furthermore, either the second control transistors TR5-1 and TR5-2 or the third control transistors TR6-1 and TR6-2 may be connected to the first voltage input terminal V1 instead of the second voltage input terminal V2.

The inverter part 230 outputs a switching signal to the second node NA. The inverter part 230 includes first to fourth inverter transistors TR7, TR8, TR9, and TR10. The first inverter transistor TR7 includes an input electrode and a control electrode which are connected to the clock terminal CK in common, and an output electrode connected to a control electrode of the second inverter transistor TR8. The second inverter transistor TR8 includes an input electrode connected to the clock terminal CK and an output electrode connected to the second node NA.

The third inverter transistor TR9 includes an output electrode connected to the output electrode of the first inverter transistor TR7, a control electrode connected to the carry terminal CR, and an input electrode connected to the second voltage input terminal V2. The fourth inverter transistor TR10 includes an output electrode connected to the second node NA, a control electrode connected to the carry terminal CR, and an input electrode connected to the second voltage input terminal V2. According to an embodiment of the inventive concept, the control electrodes of the third and fourth inverter transistors TR9 and TR10 may be connected to the output terminal OUT, and the output electrodes of the third and fourth inverter transistors TR9 and TR10 may be connected to the first voltage input terminal V1.

The first pull-down part 240-1 includes first and second pull-down transistors TR2 and TR3 The first pull-down transistor TR2 includes an input electrode connected to the first voltage input terminal V1, a control electrode connected to the control terminal CT, and an output electrode connected to the output electrode of the first output transistor TR1.

The second pull-down transistor TR3 includes an input electrode connected to the first voltage input terminal V1, a control electrode connected to the second node NA, and an output electrode connected to the output electrode of the first output transistor TR1. According to an embodiment of the inventive concept, at least any one of the input electrode of the first pull-down transistor TR2 and the input electrode of the second pull-down transistor TR3 may also be connected to the second voltage input terminal V2.

The voltage of the third gate signal GS3 corresponds to the voltage of the output electrode of the first output transistor TR1. The first pull-down transistor TR2 provides the output electrode of the first output transistor TR1 with the first voltage VSS1, in response to the fourth carry signal. The second pull-down transistor TR3 provides the output electrode of the first output transistor TR1 with the first voltage VSS1, in response to a switching signal output from the second node NA.

The second pull-down part 240-2 includes third and fourth pull-down transistors TR11 and TR12. The third pull-down transistor TR11 includes an input electrode connected to the second voltage input terminal V2, a control electrode connected to the control terminal CT, and an output electrode connected to the output electrode of the second output transistor TR13.

The fourth pull-down transistor TR12 includes an input electrode connected to the second voltage input terminal V2, a control electrode connected to the second node NA, and an output electrode connected to the output electrode of the second output transistor TR13. According to an embodiment of the inventive concept, at least any one of the input electrode of the third pull-down transistor TR11 and the input electrode of the fourth pull-down transistor TR12 may also be connected to the first voltage input terminal V1.

The voltage of the third carry signal CRS3 corresponds to the voltage of the output electrode of the second output transistor TR13. The third pull-down transistor TR11 provides the output electrode of the second output transistor TR13 with the second voltage VSS2, in response to the fourth carry signal. The fourth pull-down transistor TR12 provides the output electrode of the second output transistor TR13 with the second voltage VSS2, in response to a switching signal output from the second node NA.

Figure 7A:
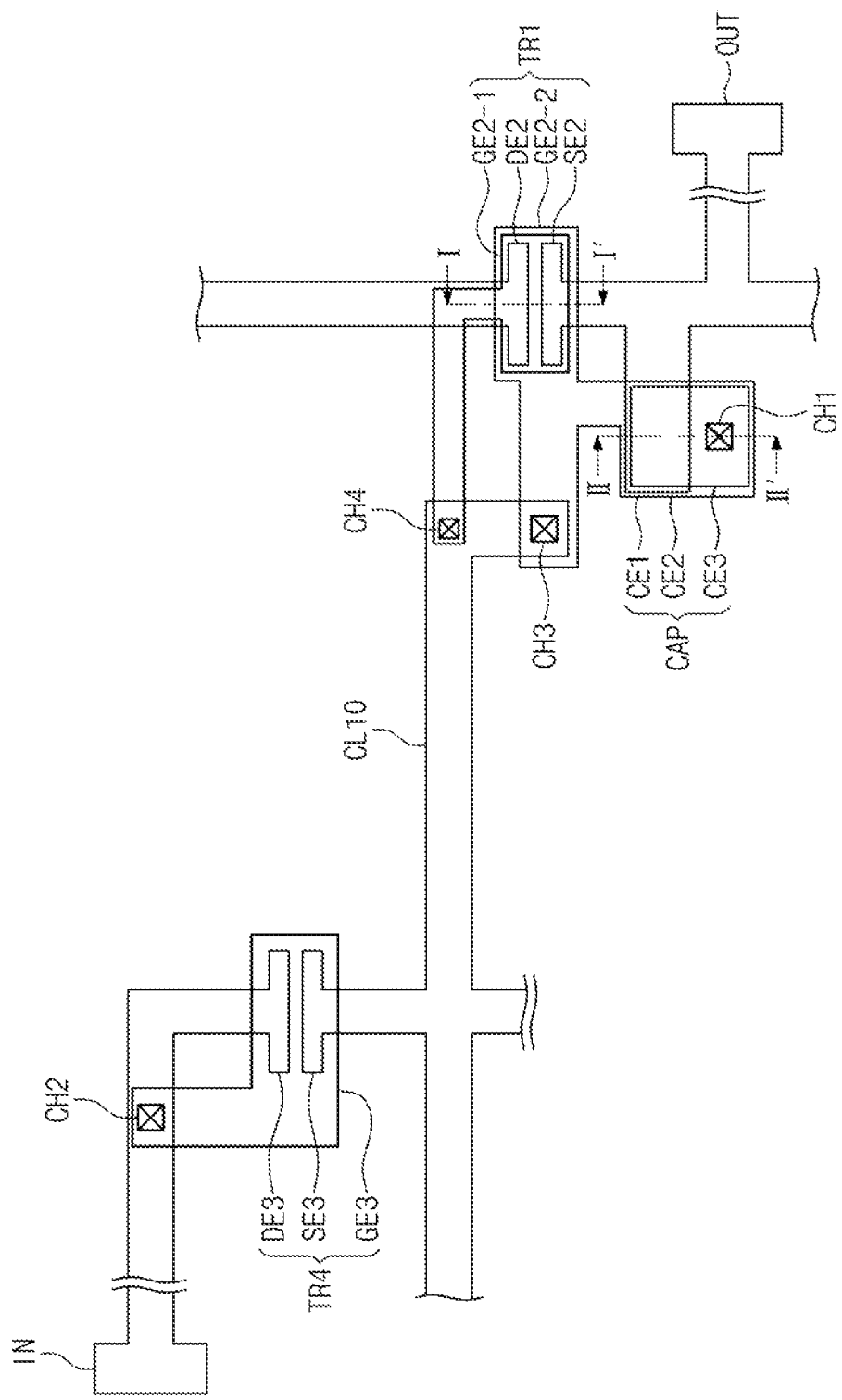
FIG. 7A is a layout illustrating a portion of the driving stage illustrated in FIG. 5.
Figure 7B:
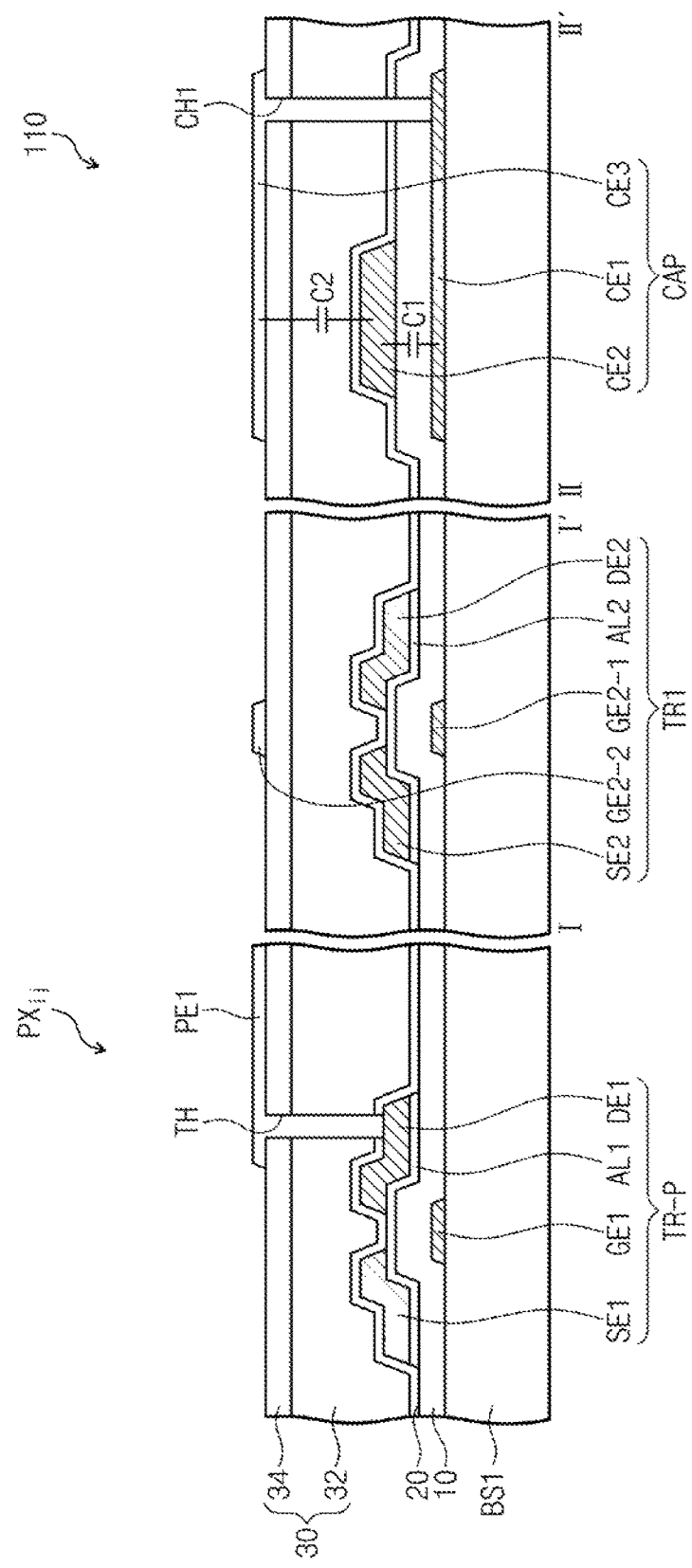
FIG. 7B is a sectional view illustrating a portion of a first substrate according to an embodiment of the inventive concept.
Figure 7C:
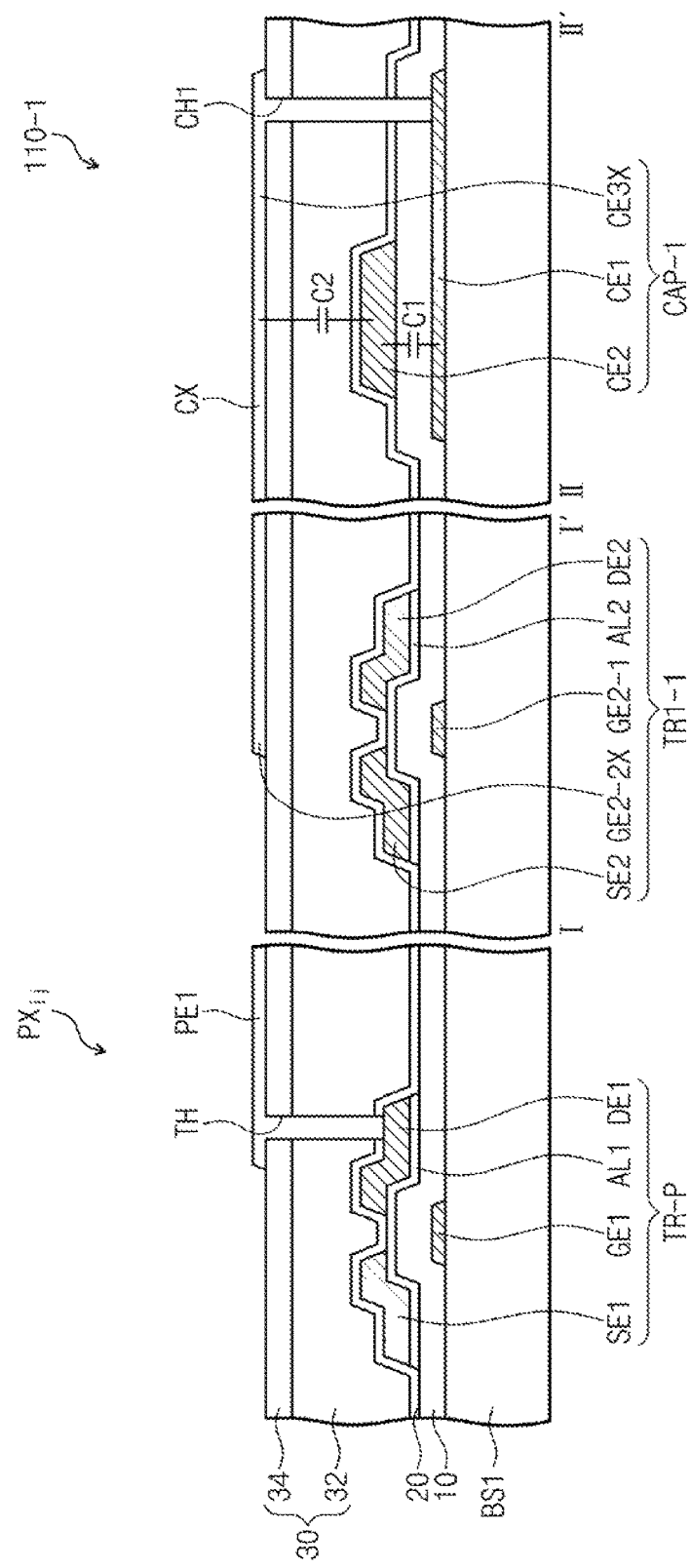
FIG. 7C is a sectional view illustrating a portion of a first substrate according to another embodiment of the inventive concept.

FIG. 7A is a layout illustrating a portion of the driving stage illustrated in FIG. 5. FIG. 7B is a sectional view illustrating a portion of a substrate according to an embodiment of the inventive concept. FIG. 7C is a sectional view illustrating a portion of a substrate according to an embodiment of the inventive concept.

FIG. 7A illustrates the first output transistor TR1, the first control transistor TR4, the capacitor, and connection structure thereof. FIG. 7B illustrates a sectional view taken along lines I-I' and II-II' together with a portion of a pixel. FIG. 7C illustrates a sectional view of a region corresponding to FIG. 7B. Meanwhile, for the same configurations as those described in FIGS. 1 to 6, the same reference numerals are assigned and specific descriptions will be omitted.

The driving stage SRC3 (see FIG. 3) includes a first conductive layer, a second conductive layer, a third conductive layer, and an activation layer which are disposed on different layers. The first, second, and third conductive layers may include a plurality of patterned electrodes and a plurality of wirings. The activation layer includes a plurality of patterned portions. Insulating layers are disposed between the first and second conductive layers, and between the second and third conductive layers, respectively.

A portion of the first conductive layer constitutes first control electrodes GE2-1 and GE3 of the transistors TR1 and TR4, and a first electrode CE1 of the capacitor CAP. A portion of the second conductive layer constitutes input electrodes SE2 and SE3 and output electrodes DE2 and DE3 of the transistors TR1 and TR4, and a second electrode CE2 of the capacitor CAP.

The second conductive layer may include a first wiring CL10 which connects the transistors TR1 and TR4. The first wiring CL10 corresponds to the first node NQ in FIG. 5.

A portion of the third conductive layer may constitute a second control electrode GE2-2 of the first output transistor TR1, and a third electrode CE3 of the capacitor CAP. Although not illustrated, when the first control transistor TR4 has a dual-gate structure, the third conductive layer may further include a second control electrode (not illustrated) of the first control transistor TR4.

The plurality of portions included in the activation layer constitute activation parts of the transistors TR1 and TR4. In FIG. 7A, the activation parts of the transistors TR1 and TR4 are not illustrated.

The second conductive layer may include the first wiring CL10 which connects the transistors TR1 and TR4. The first wiring CL10 corresponds to the first node NQ in FIG. 5.

The first control electrode GE2-1 of the first output transistor TR1 and the first wiring CL10 may be connected to each other via a contact hole CH3 which passes through the insulating layer disposed between the first and second conducive layers. The first control electrode GE2-1 of the first output transistor TR1 is connected to the first electrode CE1 of the capacitor CAP. The output electrode DE1 of the first output transistor TR1 is connected to the second electrode CE2 of the capacitor CAP.

The second control electrode GE2-2 and the first wiring CL10 may be connected to each other via a contact hole CH4 which passes through the insulating layer disposed between the second and third conductive layers. Accordingly, the first and second control electrodes GE2-1 and GE2-2 may be operated by the same electric signal applied thereto. Alternatively, although not illustrated, the second control electrode GE2-2 may also be connected to a separate terminal and operated by an independent electric signal different from the signal applied to the first control electrode GE2-1.

Alternatively, although not illustrated, the first, second, and third conductive layers may be simultaneously connected. The first and second conductive layers are connected via a first through hole (not illustrated) which passes through the first insulating layer 10, and the second and third conductive layers are connected via a second through hole (not illustrated) which passes through the second and third insulating layers 20 and 30. For example, the first control electrode GE2-1, the second control electrode GE2-2, and the first wiring CL10 may be connected via one contact hole.

In this case, when the first and second through holes are formed to be overlapped with each other, the third conductive layer may be connected to the second conductive layer which is connected to the first conductive layer, while overlapping the second conductive layer. Accordingly, a separate bridge conductive pattern to connect the first to third conductive layers may be omitted, and the layout area of a driving circuit may thus be reduced.

As illustrated in FIG. 7B, the first conductive layer, the second conductive layer, the third conductive layer, and the activation layer may correspond to configurations of a pixel PXij disposed in the pixel region PXA. The first conductive layer, the second conductive layer, the third conductive layer, and the activation layer may be formed by the same process as the corresponding configurations of the pixel. The first and second insulating layers 10 and 20 insulating each conductive layer form the same layer as the first and second insulating layers 10 and 20 in FIG. 3, respectively.

For example, the first control electrode GE2-1 of the first output transistor TR1 and the first electrode CE1 of the capacitor CAP each may be disposed on the layer on which the control electrode GE1 of the pixel transistor TR-P is disposed, made of the same material as the control electrode GE1 of the pixel transistor TR-P, and have the same layer structure as the control electrode GE1 of the pixel transistor TR-P. An activation part AL2 of the first output transistor TR1 is disposed on the layer on which the activation part AL1 of the pixel transistor TR-P is disposed.

The input electrode SE2 and the output electrode DE2 of the first output transistor TR1, and the second electrode CE2 of the capacitor CAP are disposed on the layer on which the input electrode SE1 and the output electrode DE1 of the pixel transistor TR-P are disposed. The input electrode SE2 and the output electrode DE2 of the first output transistor TR1, and the second electrode CE2 of the capacitor CAP may be made of the same material as the input electrode SE1 and the output electrode DE1 of the pixel transistor TR-P and have the same layer structure as the input electrode SE1 and the output electrode DE1 of the pixel transistor TR-P.

The second control electrode GE2-2 of the first output transistor TR1 and the third electrode CE3 of the capacitor CAP are disposed on the layer on which the first display electrode PE1 is disposed. The second control electrode GE2-2 of the first output transistor TR1 and the third electrode CE3 of the capacitor CAP may be made of the same material as the first display electrode PE1, and have the same layer structure as the first display electrode PE1.

The first output transistor TR1 has a dual-gate structure. The first and second control electrodes GE2-1 and GE2-2 are disposed respectively on lower and upper sides around the activation part AL2, and control charge mobility of the activation part AL2. Since the first output transistor TR1 includes the two control electrodes GE2-1 and GE2-2, charge mobility of the activation part AL2 may be improved, driving current of the first output transistor TR1 may increase, and on-off characteristics may thus be improved.

The capacitor CAP has a dual-capacitor structure. The first to third insulating layers 10, 20, and 30 may have dielectric materials. Therefore, the first and second electrodes CE1 and CE2 constitute one capacitor C1 with the first insulating layer 10 disposed therebetween. Furthermore, the second and third electrodes CE2 and CE3 constitute one capacitor C2 with the second and third insulating layers 20 and 30 disposed therebetween.

In this embodiment, the third electrode CE3 is connected to the first electrode CE1 via a first contact hole CH1 which passes through the first to third insulating layers 10, 20, and 30. Therefore, the third electrode CE3 has substantially the same electric potential as the first electrode CE1.

As illustrated in FIGS. 7A and 7B, the capacitor CAP has a structure in which the first, second, and third electrodes CE1, CE2, and CE3 are sequentially stacked, and thus has substantially the same area as a single-capacitor structure. However, the capacitor CAP has a dual-capacitor structure, and thus may generate the same effect as two capacitors connected in parallel.

Specifically, the capacitor CAP has the same capacitance as a structure in which two capacitors are spaced apart from each other on a plane. The driving stage SRC3 according to the inventive concept includes the capacitor CAP having a dual-capacitor structure, and thus may generate an improved boosting effect within the same area. Therefore, it is possible to reduce the area of the capacitor CAP for securing a designed capacitance, and the layout area of the driving circuit 200 may thus be reduced.

Furthermore, typical pixel thin film processes may still be used to form the dual-gate structure of the first output transistor TR1 and the dual-capacitor structure of the capacitor CAP according to the inventive concept. The second control electrode GE2-2 and the third electrode CE3 are disposed on the layer on which the first display electrode PE1 is disposed, and may thus be simultaneously formed in a process step in which the first display electrode PE1 is formed.

According to the inventive concept, since it is possible to reduce the layout area of the gate driving circuit 200 without any additional separate process, a display device having a narrow bezel may be realized.

Alternatively, although not illustrated, transistors of the second output part 210-2 (see FIG. 5) the control part 220 (see FIG. 5), the inverter part 230 (see FIG. 5), and the first and second pull-down parts 240-1 and 240-2 (see FIG. 5) may have the same structure as the first output transistor TR1 or the first control transistor TR4, except the second control electrode.

Alternatively, as illustrated in FIG. 7C, a common electrode CX may be disposed on the third insulating layer 30. The common electrode CX is disposed in the peripheral region PPA. The common electrode CX overlaps the first control electrode GE2-1 and the first electrode CE1.

A portion of the common electrode CX may be a second control electrode GE2-2X of a first output transistor TR1-1, and the other portion of the common electrode CX may be a third electrode CE3X of a capacitor CAP-1. In other words, the second control electrode GE2-2X and the third electrode CE3X may have an integrated shape with being connected to each other.

In this case, the first output transistor TR1 may have a sink structure including the second control electrode GE2-2X to which the same voltage as the first control electrode GE2-1 is applied. Accordingly, the second control electrode GE2-2X and the third electrode CE3X may be connected to the first electrode CE1 via the contact hole CH1, and thus controlled by the same signal at the same time.

In the gate driving circuit 200 (FIG. 1) according to an embodiment of the inventive concept, the first output transistors TR1 and TR1-1 have a dual-gate structure, and the capacitors CAP and CAP-1 have a dual-capacitor structure. The gate driving circuit 200 may improve channel mobility of the first output transistor TR1 and capacitance characteristics of the capacitor CAP without any change in areas or component materials.

Furthermore, since the gate driving circuit 200 may have a layer structure corresponding to configurations of a pixel PXij, there is the advantage that no additional layer structure design for the gate driving circuit 200 is required. Therefore, the design of the gate driving circuit 200 may be simplified, and process errors may thus be reduced.

Figure 8A:
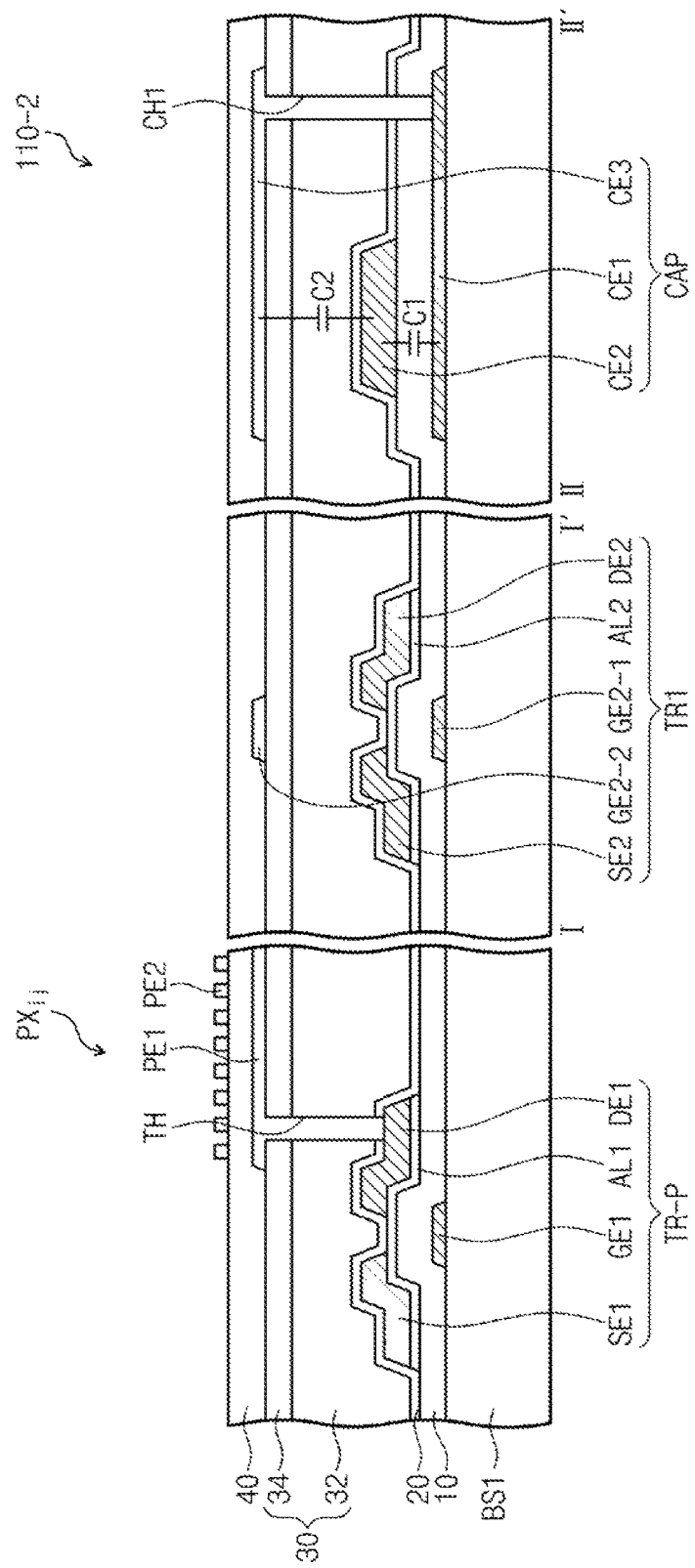
FIGS. 8A and 8B are sectional views illustrating as portion of a first substrate according to embodiments of the inventive concept.
Figure 8B:
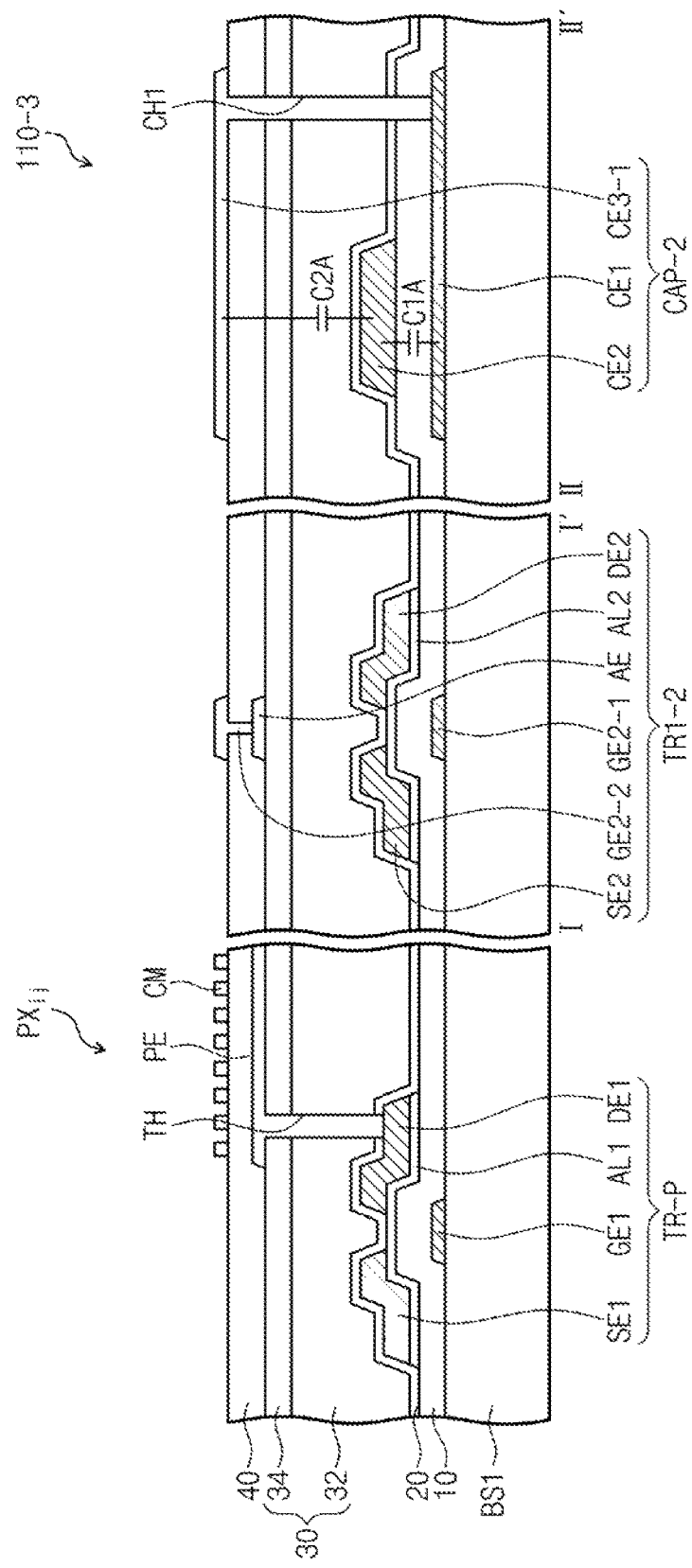

FIGS. 8A and 8B are sectional views illustrating a portion of a substrate according to an embodiment of the inventive concept. Various structures of a display deuce according to an embodiment of the inventive concept will be described, with reference to FIGS. 8A and 8B. Meanwhile, for the same configurations as those illustrated in FIGS. 1 to 7C, the same reference numerals are assigned and specific descriptions will be omitted.

A first substrate 110-2 illustrated in FIG. 8A is the same as the first substrate 110 in FIG. 7B except that the first substrate 110-2 further includes a fourth insulating layer 40 and the second display electrode PE2. The second display electrode PE2 is disposed on the first display electrode PE1, and spaced apart from the first display electrode PE1 with the fourth insulating layer 40 disposed therebetween. In this case, a liquid crystal layer LCL (FIG. 3) may be disposed on the second display electrode PE2.

The second display electrode PE2 includes at least one slit. FIG. 8A illustrates a second display electrode PE2 including a plurality of slits. Each slit and the first display electrode PE1 generate an electric field in relation to each slit to control transmittance of the liquid crystal layer LCL.

The fourth insulating layer 40 may be disposed on the entire surface of the first base substrate BS1. The fourth insulating layer 40 covers the pixel region PXA and the peripheral region PPA.

The second control electrode GE2-2 is covered with the fourth insulating layer 40 such that it is not exposed to the outside. Therefore, an electrostatic phenomenon which may be generated in the second control electrode GE2-2 is prevented, and reliability of the first output transistor TR1 may thus be improved.

A first substrate 110-3 in FIG. 8B is the same as the first substrate 110-2 in FIG. 8A except the second control electrode GE2-2 and the third electrode CE3-1. As illustrated in FIG. 8B, the second control electrode GE2-2 and the third electrode CE3-1 may be disposed on the fourth insulating layer 40. The third electrode CE3-1 is connected to the first electrode CE1 via a through hole TH which passes through the first to fourth insulating layers 10, 20, 30, and 40.

A first output transistor TR1-2 may further include a sub-electrode AE. The sub-electrode AE is disposed between the third and fourth insulating layers 30 and 40, and overlaps the first and second control electrodes GE2-1 and GE2-2. The second control electrode GE2-2 passes through the fourth insulating layer 40 and is connected to the sub-electrode AE.

Therefore, the second control electrode GE2-2 of the first output transistor TR1 in FIG. 8A and the second control electrode GE2-2 of the first output transistor TR1-2 in FIG. 8B may be spaced apart from the activation part AL2 at a substantially equal distance. A display device according to an embodiment of the inventive concept may maintain characteristics of transistor to be substantially equal even if the second control electrode is disposed in a different position.

A capacitor CAP-2 includes the second and third electrodes CE2 and CE3-1 which generate an electric field between the second, third, and fourth insulating layers 20, 30, and 40. The capacitor CAP-2 may have capacitance including two capacitance values C1A and C2A. Therefore, the capacitor CAP-2 may be affected by the thickness and component materials of the fourth insulating layer 40.

Figure 9:
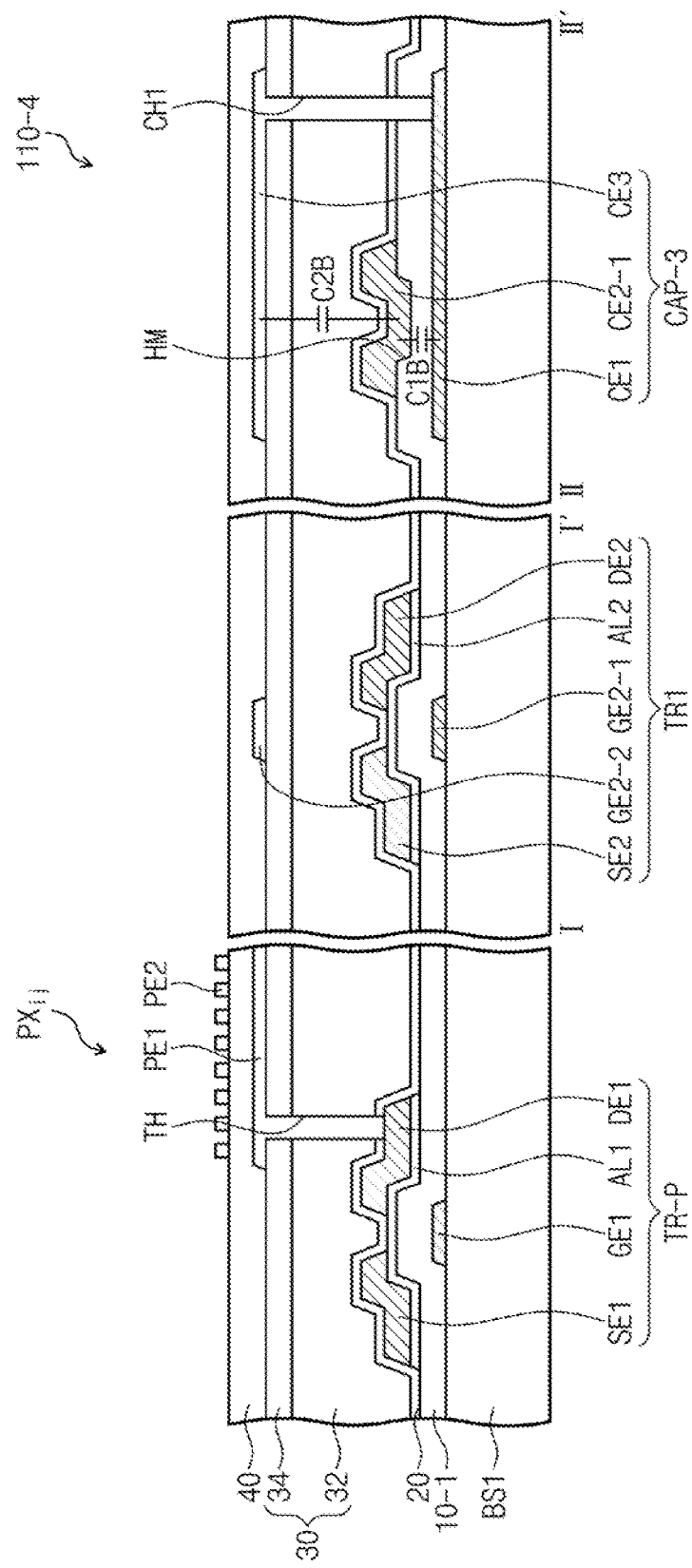
FIG. 9 is a sectional view illustrating a portion of a first substrate according to an embodiment of the inventive concept.

FIG. 9 is a sectional view illustrating a portion of a substrate according to an embodiment of the inventive concept FIG. 9 illustrates an embodiment corresponding to the first substrate 110-2 in FIG. 8A, except a first insulating layer 10-1. Meanwhile, for the same configurations as those illustrated in FIGS. 1 to 8B, the same reference numerals are assigned and specific descriptions will be omitted.

The first insulating layer 10-1 of a first substrate 110-4 further includes a recessed portion HM. The recessed portion HM is defined in a portion of region on the first insulating layer 10-1, which overlaps a portion of the first electrode CE1.

The recessed portion HM is formed concavely from the upper surface of the adjacent first insulating layer 10-1. Therefore, when the first insulating layer 10-1 has a substantially uniform thickness, the thickness of the first insulating, layer 10-1 at the recessed portion HM is less than that of the first insulating layer 10-1 at the other portion.

The second electrode CE2 is disposed on the recessed portion HM. Therefore, a minimum linear distance that the second electrode CE2 is spaced apart from the first electrode CE1 is less when measured at the recessed portion HM than when measured at the periphery of the recessed portion HM.

That is, when the capacitor CAP in FIG. 8 and the capacitor CAP-3 in FIG. 9 have substantially the same area and layer structure, capacitance of a capacitor C1B between the first and second electrodes CE1 and CE2 may increases because the first substrate 110-4 further includes the recessed portion HM. Accordingly, a gate driving circuit including a capacitor having an improved capacitance may be provided by controlling the thickness of the first insulating layer 10-1 despite the same area and structure.

FIGS. 10A to 10F are sectional views illustrating a method of manufacturing a display device according to an embodiment of the inventive concept. Meanwhile, for the same configurations as those illustrated in FIGS. 1 to 9, the same reference numerals are assigned and repetitive descriptions will be omitted.

Figure 10A:
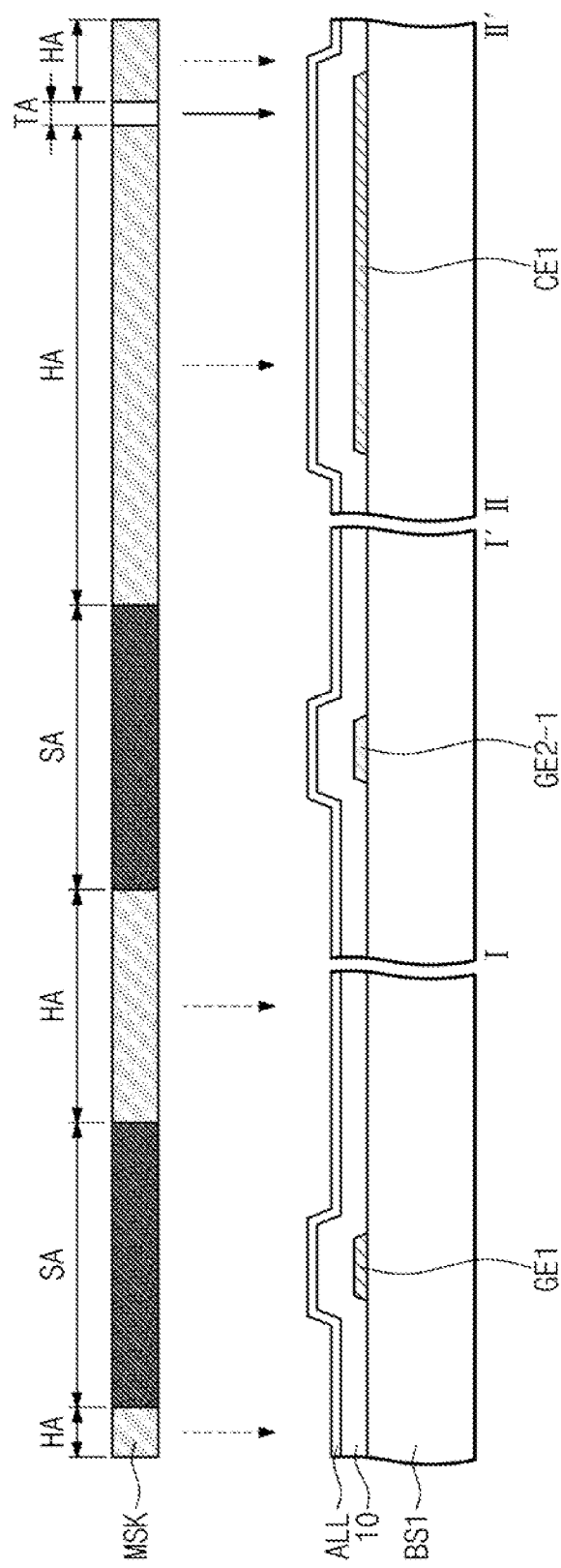
FIGS. 10A to 10F are sectional views illustrating a method of manufacturing a display device according to embodiments of the inventive concept.

As illustrated in FIG. 10A, a first conductive layer, a first insulating layer 10, and a semiconductor layer AL-A are sequentially formed on a first base substrate BS1. The first conductive layer includes a plurality of conductive patterns. The conductive patterns may include the control electrode GE1 of a pixel, the first control electrode GE2-1 of the first output transistor TR1, and the first electrode CE1.

The first insulating layer 10 and the semiconductor layer AL-A may be formed by means of a vapor deposition process. The first insulating layer 10 and the semiconductor layer AL-A cover the control electrode GE1, the first control electrode GE2-1 of the first output transistor TR1, and the first electrode CE1.

Figure 10B:
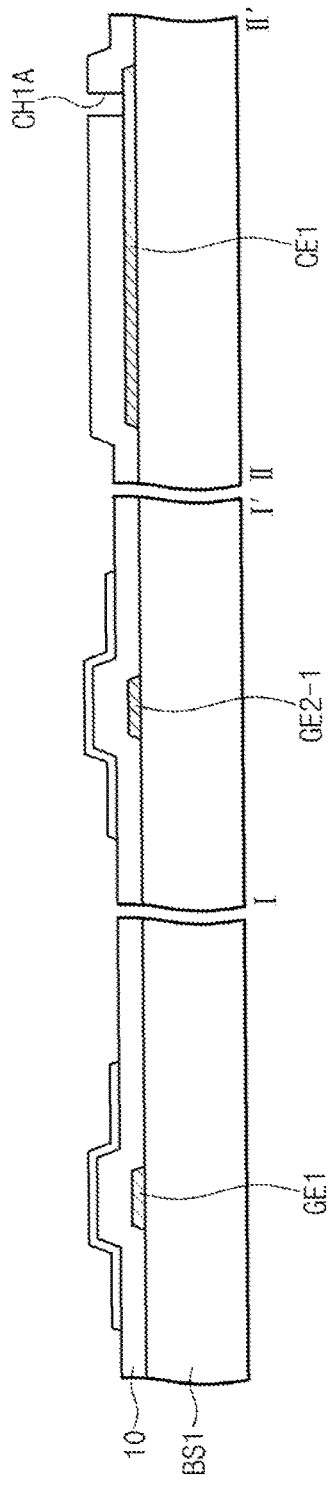

Subsequently, as illustrated in FIGS. 10A and 10B, activation parts AL1 and AL2 are formed by patterning the semiconductor layer AL-A. A mask MSK may be used during the process of patterning the semiconductor layer AL-A.

The mask MSK may be a halftone mask including at least one light shielding region SA in which light is blocked, at least one light transmitting region TA in which light can be transmitted, and at least one semi-transmitting region HA in which only a portion of incident light can be transmitted. Although not illustrated, a photoresist layer may be disposed on the semiconductor layer AL.

The activation parts AL1 and AL2 may be formed by means of various processes. For example, the activation parts AL1 and AL2 may be formed by means of a wet etching process using an etching solution. Although not specifically illustrated, the activation parts AL1 and AL2 may be formed through the steps of forming a pattern on the photoresist layer according to a mask MSK pattern by radiating light, forming the activation parts through a wet etching process, forming a through hole CH1A through a dry etching process, and then removing the patterned photoresist layer.

Accordingly, in a region overlapping the light transmitting region TA in which light can be transmitted, both the semiconductor layer AL and the first insulating layer 10 are removed to form a through hole CH1A, and a portion of the first electrode CE1 is exposed. In a region overlapping the light shielding region SA in which light is blocked, the semiconductor layer AL remains to define the activation parts AL1 and AL2. In a region overlapping the semi-transmitting region in which only a portion of light can be transmitted, the semiconductor layer AL is removed and the first insulating layer 10 remains.

Figure 10C:
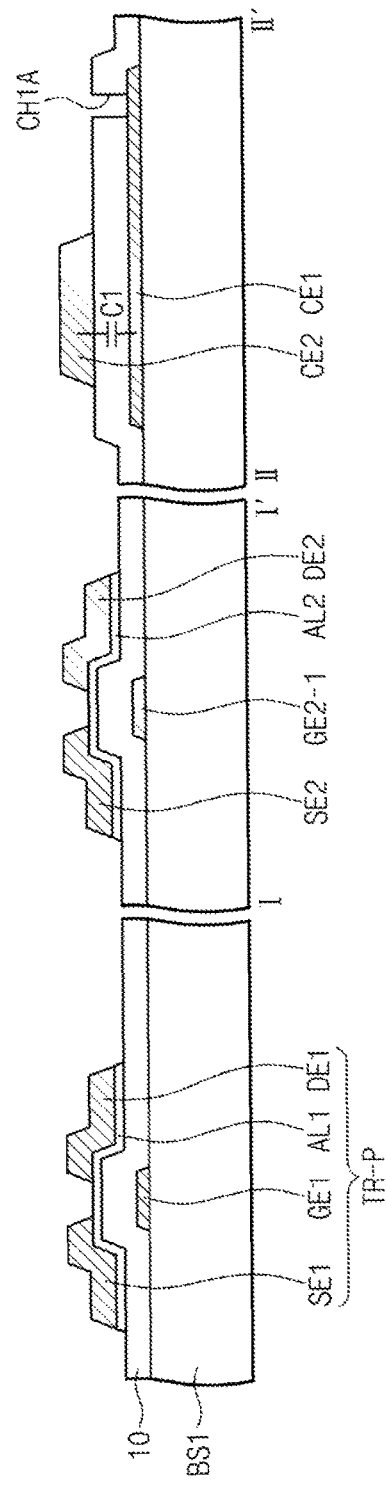

Subsequently, as illustrated in FIG. 10C, a second conductive layer is formed on the first insulating layer 10. The second conductive layer includes a plurality of conductive patterns. The conductive, patterns includes the input electrode SE1 and the output electrode DE1 of the pixel transistor TR-P, the input electrode SE2 and the output electrode DE2 of the first output transistor TR1, and the second electrode CE2.

The second conductive layer may be formed by means of a vapor deposition process or a sputtering process. The second conductive layer may be patterned from a basal layer using a mask or partially deposited through a mask to form conductive patterns. Accordingly, the second conductive layer may be formed into patterns having a shape designed in a predetermined region.

Alternatively, although not illustrated, the activation parts AL1 and AL2 and the second conductive layer may be formed at the same time. For example, the semiconductor layer AL and a basal layer (not illustrated) including and a conductive material are formed on the entire surface of the first base substrate BS1, and then the semiconductor layer AL and the basal layer may be patterned at the same time to for the activation parts AL1 and AL2, the input electrode SE2 and the output electrode DE2 of the first output transistor TR1, and the second electrode CE2. In this case, an activation part (not illustrated) having the same shape as the second electrode CE2 may be further disposed between the second electrode CE2 and the first insulating layer 10.

Figure 10D:
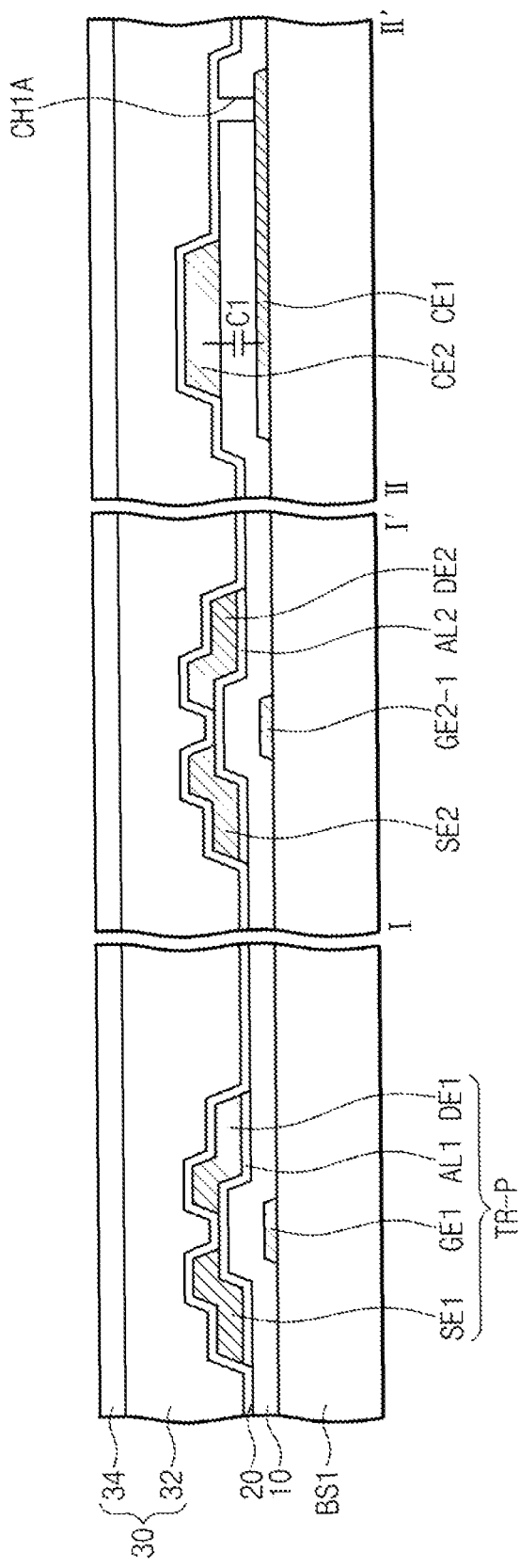

Subsequently, as illustrated in FIG. 10D, second and third insulating layers 20 and 30 are sequentially formed on the second conductive layer. The second and third insulating layers 20 and 30 may be formed on the entire surface of the first base substrate BS1 so as to overlap the through hole CH1A.

The second and third insulating layers 20 and 30 may be formed by means of a vapor deposition process or a sputtering process. Furthermore, when layers 32 and 34 constituting the third insulating layer 30 include an organic layer 32, the organic layer 32 may also be formed by means of a coating process.

Figure 10E:
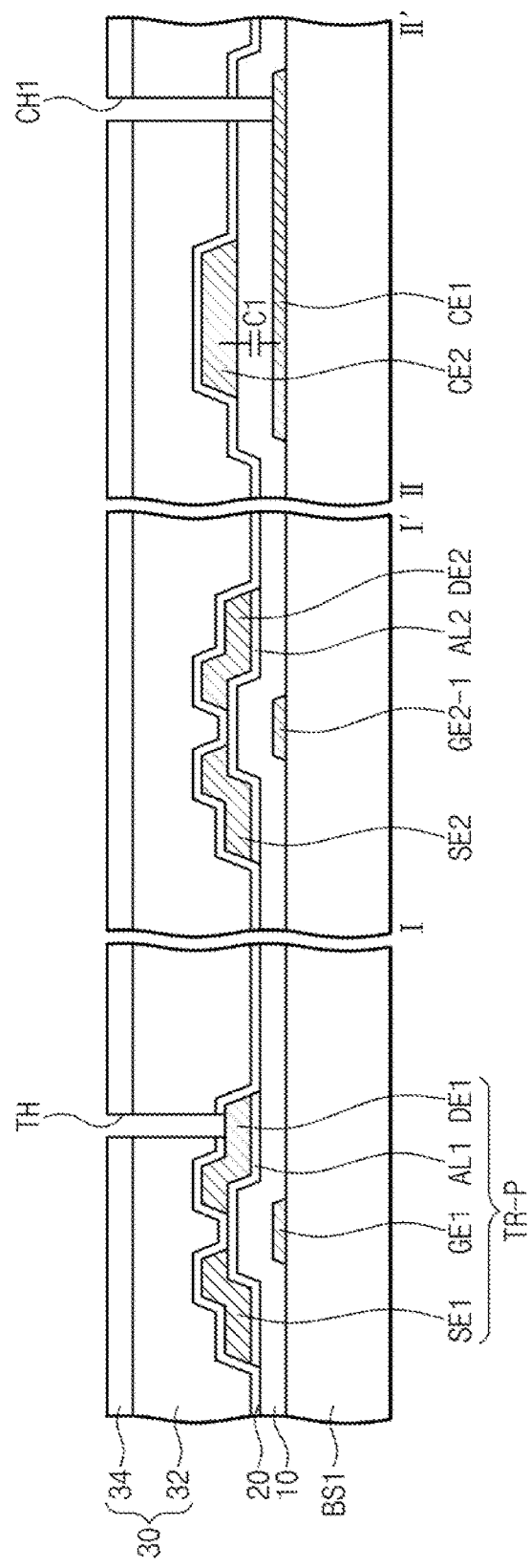
Figure 10F:
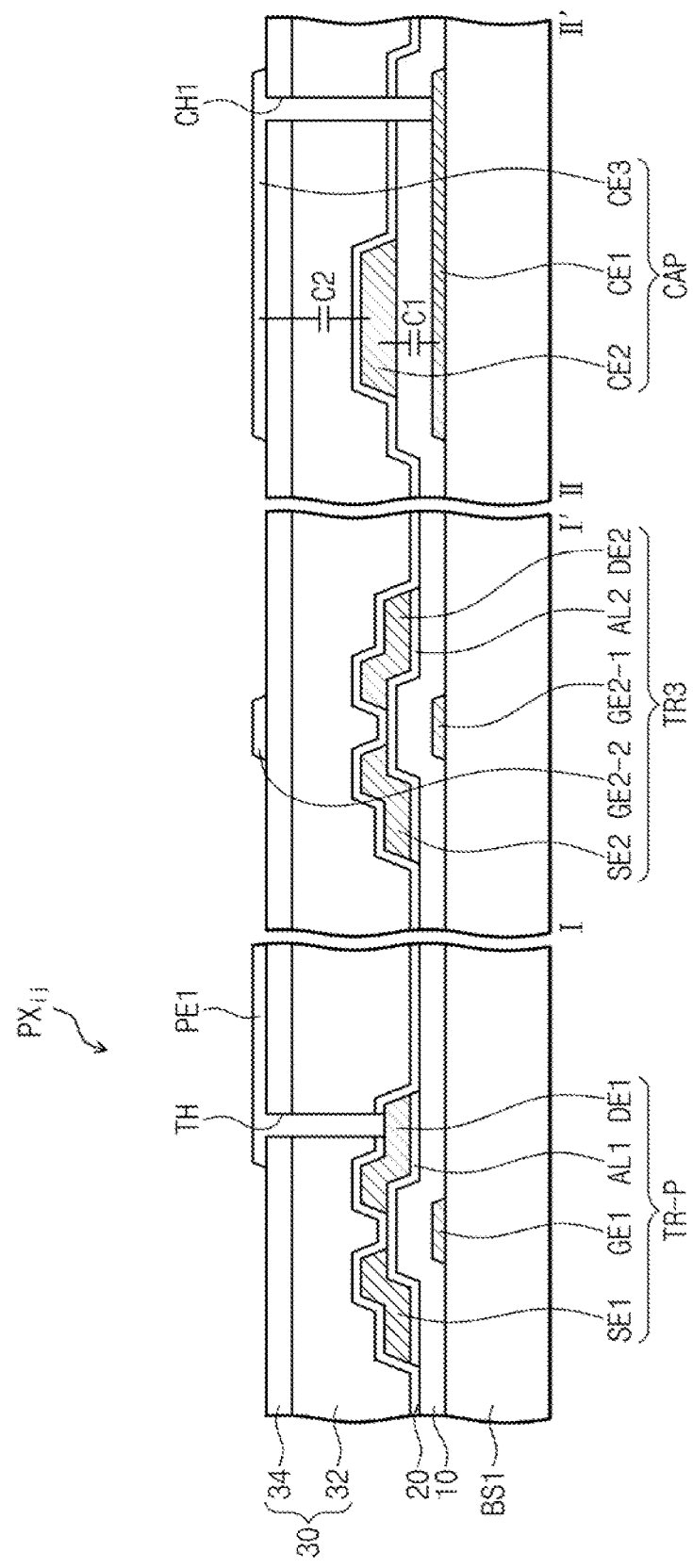

Subsequently, as illustrated in FIG. 10E, contact holes TH and CH1 are formed in the second and third insulating layers 20 and 30. The contact holes TH and CH1 include a through hole TH exposing a portion of the pixel transistor TR-P, and a contact hole CH1 exposing at least a portion of the first electrode CE1.

In a method of manufacturing a display device according to an embodiment of the inventive concept, the through hole CH1A is formed in the first insulating layer 10 in advance, and then the contact hole CH1 which passes through the second and third insulating layers 20 and 30 is formed. The first insulating layer 10 has a relatively large thickness compared with the second and third insulating layers 20 and 30. Accordingly, the method of manufacturing a display device according to the inventive concept forms the contact hole CH1 by removing only the second and third insulating layers 20 and 30 which are relatively easy to be removed, so that the process may be simplified and process errors may be reduced.

Subsequently, as illustrated in FIG. 10E, a third conductive layer is formed on the third insulating layer 30. The third conductive layer may include the second control electrode GE2-2 and the third electrode CE3. The third electrode CE3 is connected to the first electrode CE1 via the contact hole CH1.

In this case, the third conductive layer may be formed simultaneously with the first display electrode PE1 of the pixel region PXA. Accordingly, the first display electrode PE1, the second control electrode GE2-2, and the third electrode CE3 may be formed at the same time in one process chamber, and patterned at the same time using one mask.

In a method of manufacturing a display device according to an embodiment of the inventive concept, elements in the pixel region PXA and the peripheral region PPA may be formed using the same mask in the same process line without any additional process for forming the gate driving circuit 200. Therefore, elements disposed in each region of the first substrate 110 may be formed at the same time for each layer constituting the elements and thus process margins may be reduced and yields may be improved.

Furthermore, a dual-gate structure and a dual-capacitor structure may be realized using a typical process without any additional process. Therefore, manufacturing costs of a display device may be reduced.

A gate driving circuit according to the inventive concept includes a capacitor having a dual-capacitor structure and a thin film transistor having a dual-gate structure. Therefore, the gate driving circuit may reduce the area of a capacitor while securing capacitance within the standard, thereby reducing the layout area of the gate driving circuit.

Furthermore, a gate driving circuit according to the inventive concept is disposed on the layer on which elements disposed on pixels are disposed. Therefore, typical processes may still be used to realize a dual-gate structure and a dual-capacitor structure, and manufacturing process margins of a display device may thus be reduced.

Although the inventive concept has been described with reference to the embodiments, those skilled in the art will appreciate that the present invention can be changed or modified in various was without departing from the spirit and scope of the present invention described in the appended claims. Furthermore, the embodiments disclosed in the present mention is not intended to limit the inventive concept, but all spirits within the scope and equivalent scope of the appended claims will be construed to be included in the scope of the present invention.

What is claimed is:

1. A display device, comprising:
   a base substrate divided into a pixel region and a peripheral region adjacent to the pixel region;
   pixels disposed in the pixel region;
   first signal lines connected to the pixels, and each of the first signal lines extends in one direction;
   second signal lines connected to the pixels, crossing and electrically insulated from the first signal lines;
   a first insulating layer disposed between the first and second signal lines;
   a second insulating layer disposed on the second signal lines; and
   a driving circuit disposed in the peripheral region to provide the first signal lines with electrical signals, the driving circuit includes a driving transistor and a driving capacitor connected to the driving transistor,
   wherein:
   the driving transistor comprises:
      a first control electrode disposed on a same layer as a layer on which the first signal lines are disposed;
      an activation part overlapping the first control electrode;
      an input electrode disposed on a same layer as a layer on which the second signal lines are disposed and overlapping the activation part;
      an output electrode disposed on a same layer as a layer on which the second signal lines are disposed, spaced apart from the input electrode, and overlapping the activation part; and
      a second control electrode disposed on the input electrode and the output electrode and overlaps the first control electrode;
   the capacitor comprises:
      a first electrode disposed on a same layer as a layer on which the first signal lines are disposed;
      a second electrode disposed on a same layer as a layer on which the second signal lines are disposed; and
      a third electrode disposed on a same layer as a layer on which the second control electrode is disposed;
   the first electrode is electrically connected to the third electrode;
   the input electrode, the output electrode, and the second electrode are disposed on the first insulating layer;
   the second control electrode and the third electrode are disposed on the second insulating layer;
   the third electrode is connected to the first electrode by passing through the first and second insulating layers;
   each of the pixels comprises:

a pixel transistor connected to a corresponding first signal line of the first signal lines and a corresponding second signal line of the second signal lines; and a liquid crystal capacitor including a first display electrode electrically connected to the pixel transistor, and a second display electrode disposed on the first display electrode and forming an electric field with the first display electrode to control a liquid crystal layer disposed on the first display electrode; and the liquid crystal capacitor is disposed on the second insulating layer.

2. The display device of claim 1, wherein
the second display electrode is spaced apart from the first display electrode with the liquid crystal layer disposed therebetween, and
the second control electrode and the third electrode are disposed on the layer on which the first display electrode is disposed.

3. The display device of claim 1, further comprising a third insulating layer covering the first display electrode, wherein
the liquid crystal layer is disposed on the third insulating layer, and the second display electrode is disposed between the third insulating layer and the liquid crystal layer.

4. The display device of claim 3, wherein
the second control electrode and the third electrode are disposed on the layer on which the second display electrode is disposed, and
the third electrode is connected to the first electrode by passing through the first to third insulating layers.

5. The display device of claim 4, further comprising a sub-electrode which is disposed between the second and third insulating layers and overlaps the first control electrode, wherein
the second control electrode is connected to the sub-electrode by passing through the third insulating layer.

6. The display device of claim 3, wherein the second control electrode and the third electrode are disposed on the layer on which the first display electrode is disposed.

7. The display device of claim 3, wherein at least any one of the first and second display electrodes comprises at least one slit.

8. The display device of claim 1, wherein the first insulating layer further comprises a recessed portion defined in a region overlapping the first electrode, and
the second electrode is disposed on the recessed portion.

* * * * *